United States Patent [19]
Koriyama et al.

[11] Patent Number: 5,563,117
[45] Date of Patent: Oct. 8, 1996

[54] COPPER OXIDE SUPERCONDUCTOR, A PROCESS FOR ITS PRODUCTION, AND A COPPER USED THEREIN

[75] Inventors: Shinichi Koriyama, Tokyo; Takaaki Ikemachi, Moriguchi; Hisao Yamauchi, Tokyo, all of Japan

[73] Assignees: Kyocera Corporation, Kyoto, Japan; International Superconductivity Technology Center; Sanyo Electric Co., Ltd., Osaka, Japan

[21] Appl. No.: 357,100

[22] Filed: Dec. 15, 1994

Related U.S. Application Data

[60] Continuation of Ser. No. 91,560, Jul. 15, 1993, abandoned, which is a division of Ser. No. 984,979, Nov. 30, 1992, abandoned.

[30] Foreign Application Priority Data

Nov. 28, 1991 [JP] Japan ................... 3-314943
Dec. 9, 1991 [JP] Japan ................... 3-324400

[51] Int. Cl.$^6$ ................... H01B 12/00; C04B 35/624; C04B 35/505
[52] U.S. Cl. ................... 505/440; 505/441; 505/445; 505/780; 505/126; 556/113; 423/27; 423/604; 252/521
[58] Field of Search ................... 505/125, 126, 505/780, 440, 441, 445, 735; 556/113; 252/518, 521; 501/12; 423/27, 604

[56] References Cited

U.S. PATENT DOCUMENTS

| | | | |
|---|---|---|---|
| 4,942,151 | 7/1990 | Capone et al. | 505/1 |
| 4,956,336 | 9/1990 | Salama et al. | 505/1 |
| 4,973,575 | 11/1990 | Capone | 505/1 |
| 5,004,720 | 4/1991 | Kobayashi et al. | 505/440 |
| 5,006,508 | 4/1991 | Treacy et al. | 505/440 |
| 5,011,823 | 4/1991 | Jin et al. | 505/1 |
| 5,024,992 | 6/1991 | Morris | 505/1 |
| 5,053,385 | 10/1991 | Capone et al. | 505/1 |
| 5,093,314 | 3/1992 | Takahashi et al. | 505/1 |
| 5,112,801 | 5/1992 | Nellis et al. | 505/1 |
| 5,135,907 | 8/1992 | Mazdiyasni et al. | 252/518 |
| 5,149,683 | 7/1992 | Wada et al. | 505/780 |
| 5,232,909 | 8/1993 | Takano et al. | 505/735 |
| 5,260,263 | 11/1993 | Enomoto et al. | 505/734 |
| 5,270,295 | 12/1993 | Hurng et al. | 505/780 |
| 5,346,730 | 9/1994 | Kruck et al. | 427/584 |

FOREIGN PATENT DOCUMENTS

| | | | |
|---|---|---|---|
| 138129 | 5/1989 | Japan | 505/735 |
| 5148273 | 5/1993 | Japan . | |

OTHER PUBLICATIONS

Chemical Abstracts, vol. 118, No. 8, Abs. No. 71327y, p. 768 (1993).

Ekin, "Transport Critical Current in Bulk Sintered $Y_1Ba_2Cu_3O_x$ and Possibilities for its Enhancement," *Advanced Ceramic Materials*, vol. 2, No. 3B, pp. 586–592 (1987).

Mangelschots et al., "O NMR Study in Aligned $YBa_2Cu_4O_8$ Powder," *Physica C* 194, May 10, 1992, pp. 277–286.

Murata et al., "Temperature Dependence of Resistivity and its Anisotropy of Ba–Y–Cu–O Single Crystals," *Jap J. Appl. Phys.* V.26(12), Dec. 1987, pp. 1941–1943.

(List continued on next page.)

Primary Examiner—Paul Lieberman
Assistant Examiner—M. Kopec
Attorney, Agent, or Firm—Loeb & Loeb LLP

[57] ABSTRACT

In the production of a 124-type or 123-type superconductor by a sol-gel method using alkoxides of respective metals, the use of a compound wherein a secbutoxy group and a hydroxy group are coordinated with a copper atom gives a superconductor composed of flat particles having a broad C plane. The dimensional ratio defined by l/d is at least 6.7 in the case of the 124-type or is at least 8.4 in the case of the 123-type. It shows a superconducting property at a liquid nitrogen temperature. This superconductor shows a higher critical current density than one obtained by a sintering method.

4 Claims, 15 Drawing Sheets

OTHER PUBLICATIONS

Hidaka et al., "Anisotropy of the Upper Critial Magnetic Field in Single Crystal $YBa_2Cu_3O_{7+y}$," *Jap J. Appl. Phys.* V26(5), May 1987, pp. L726–L728.

Kaiser et al., "Growth of $YBa_2Cu_3O_8$ Single Crystals," *Appl. Phys. Lett.*, 51 (13) Sept. 28, 1987, pp. 1040–1042.

Schoenes et al., "Anisotropy of Optical and Transport Properties . . . ," *Physica C* 166, Mar. 1, 1990, pp. 145–150.

ELECTRICAL RESISTANCE (mΩcm)

TEMPERATURE (K)

COPPER OXIDE SUPERCONDUCTOR, A PROCESS FOR ITS PRODUCTION, AND A COPPER USED THEREIN

This is a continuation of application Ser. No. 08/091,560 filed on Jul. 15, 1993, now abandoned, which is a divisional application of application Ser. No. 07/984,979, filed Nov. 30, 1992, now abandoned.

BACKGROUND OF THE INVENTION

1. Field of the Invention

This invention relates to a copper oxide superconductor having novel particle characteristics and a process for its production, and also to a novel copper complex and a process for its production.

2. Description of the Prior Art

Generally, Bi-based superconductors are used to produce wire and tape materials of copper oxide superconductors. For example, in the wire, tape and bulk section of Fourth International Superconductor Symposium, there were three reports using a Y-based superconductor, whereas there were 13 reports using a Bi-based superconductor. This was because crystal particles of Bi-based superconductors have a flat particle shape and are easily particle-oriented by a machine processing and a large critical current density is obtained since the flowing direction of a superconducting current becomes uniform. Actually, by this technique, a critical current density of at least $10^4$ (A/cm$^2$) is obtained at 77 K. (see WBP-27, 30, 39).

When a Y-based copper oxide superconductor is used for wires or tapes of a high temperature superconductor, it is known that its particles are bulky and are not oriented by a mechanical processing, and therefore, its critical current density is small. The above three reports are on 123-type superconductors, a kind of a Y-based copper oxide superconductor. Two of them form a wire material directly from a gel condition without a mechanical processing after formation of a superconductor (WBP-21) or form a superconductor tape material directly on a supporting carrier tape by a method of thin film formation (WBP-36). The remaining one report comprises forming a superconductor, adding a silver powder, and pressing the mixture by a roll (WBP-22). It only describes a critical current density of $2.1 \times 10^4$ (A/m$^2$) (at 77 K.) calculated from magnetization characteristics, and does not describe a value measured by actually flowing a current. The critical current density calculated from the magnetization value reflects the critical current density in one individual particle. It is especially known that in a sample which has gone through a partial melting process, it is considerably larger than the value measured by actually flowing an electric current (the critical current density of a sample as a whole containing a weak bond). It is therefore expected that the critical current density of the sample pressed by a roll is considerably lower than the above-mentioned value. In the case of a Y-based copper oxide superconductor, its particles are generally not flattened and are not oriented by a technique of making wires and tapes by mechanical processing. Accordingly, superconductor wires, tapes and thin plates having a high critical current density cannot be produced. On Y-based copper oxide superconductor 123-type superconductors, there is only one report that plate-like crystals were produced Ozaki et al., Nikkei Superconductors, Jul. 25, 1988, p.9). But its zero resistance temperature Tc(R=9) is about 80 K., and its application at a liquid nitrogen temperature (77 K.) is not satisfactory.

Heretofore, the synthesis of copper oxide superconductors is performed in the prior art mainly by a solid phase reaction method, a liquid phase reaction method (sol gel method, coprecipitation method), and a gaseous phase reaction method (sputtering method, evaporation method, CVD method). The solid phase method is simple in process and easy to synthesize. The liquid phase reaction method has a possibility of synthesizing at low temperatures, and of imparting shapes such as bulk, films and fibers. Furthermore, the gaseous reaction method can form a thin film. Thus, the three synthesizing methods have respective characteristics, and can be used according to the purposes.

However, in the liquid phase reaction method, synthesis at low temperatures or imparting of shapes have not been performed sufficiently. For example, in syntheses at low temperatures, the synthesis of a 124-type superconductor ($YBa_2Cu_4O_8$) as one of the copper oxide superconductor has been cited. It is reported that this 124-type superconductor ($YBa_2Cu_4O_8$) (Nature, vol. 336 (1988), p. 660) is a high temperature superconductor having a class of 80 K., and by substituting a part of Y by Ca, Tc rises to 90 K. (Nature, vol. 341 (1989), p. 660). The 124-type superconductor containing Ca is synthesized under a high oxygen pressure, and has a relatively high Tc and is thermally stable. It is considered to be a practically important material. But its synthesis requires treatment under a high oxygen pressure, and has difficulty. Recently, it has been reported that a 124-type superconductor containing Ca was synthesized at a relatively low temperature (820° C.) under atmospheric pressure (Physica C, vol. 173 (1991), p. 208). However, its Tc was 85 K., and an increase of Tc by Ca doping is small, and the transition of the superconductivity is broad. This is because a temperature of 820° C. is considered to be too high for the synthesis of a 124-type superconductor.

As to the imparting of shapes, precursors such as bulks, films and fibers of a copper oxide superconductor have not been produced by hydrolysis and polymerization of an alkoxide material.

A sol gel method using an alkoxide is an excellent technique of being able to synthesize at low temperatures or to impart shapes by synthesizing uniform precursors at an atomic level by hydrolysis and polymerization. However, in the prior synthesis of copper oxide superconductors, suitable alkoxide materials for copper as an essential element are not available, and suitable hydrolysis and polymerization 10 cannot be performed, and it has been impossible to perform synthesis at low temperatures or impart shapes. For example, when the Murakami's method of synthesizing a Ca-free 124-type superconductor at low temperatures under normal pressure (Japan J. Appl. Phys., vol. 29 (1990), p. 2720) is applied to the synthesis of a Ca-containing 124-type superconductor, an alkoxide material is used for elements other than Cu, and a nitrate salt material is used for Cu. The water of Cu nitrate hydrolyzes other alkoxide material instantaneously and precipitate it as a powder. The nitrate group selectively binds to Ba and precipitates. As soon as the nitrate salt material of Cu is mixed, all metal components become powdery, and cannot be made into fibers. The inventors have found that the effect of Ca doping cannot be sufficiently realized (Tcon=85 K.). We have also found that general alkoxide materials for Cu, such as a methoxide, propoxide, and butoxide, do not have a solubility of a practical level.

SUMMARY OF THE INVENTION

We have succeeded in synthesizing a novel copper complex in which a secondary butoxyl group and a hydroxyl group are coordinated with a copper atom, and by using this copper complex in the production of a 124-type or 123-type copper oxide superconductor, a copper oxide superconductor having particle novel characteristics and excellent superconductivity characteristics can be obtained.

An Object of this invention is to provide flat particles of a 124-type superconductor or a 123-type superconductor, which are easy to orient by mechanical processing, by realizing wires of a superconductor or tapes of a superconductor having a high critical current density at a liquid nitrogen temperature in the making of wires or tapes of a 124-type superconductor and a 123-type superconductor as a kind of Y-based copper oxide superconductors, and a process for production thereof.

Another object of this invention is to provide a copper material for a sol gel method for realizing synthesis at low temperatures or imparting of shapes, a characteristic of the inherent sol gal method, in the synthesis of a copper oxide superconductor by the sol gel method.

According to the present invention, there is provided a copper oxide superconductor having a composition of the formula

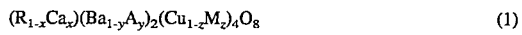
$$(R_{1-x}Ca_x)(Ba_{1-y}A_y)_2(Cu_{1-z}M_z)_4O_8 \quad (1)$$

wherein R is at least one element selected from the group consisting of Nd, Sm, Eu, Gd, Dy, Ho, Er, Tm, Yb, Lu and Y, A is at least one element selected from the group consisting of Ca, Sr and La, M is at least one element selected from the group consisting of Al, Fe, Co and Ga, and x, y and z are numbers satisfying $0 \leq x \leq 0.2$, $0 \leq y \leq 0.3$ and $0 \leq z \leq 0.2$,
and crystal particles thereof consisting of flat particles having a broad C plane and having a dimensional ratio of l/d ... (3)

wherein l is a value (μm) of a square root of the area of the C plane of said crystal particle and d is the thickness (μm) of the crystal particle, being at least 6.7, preferably at least 10.

According to the present invention, there is also provided a copper oxide superconductor having a composition of the formula

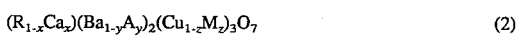
$$(R_{1-x}Ca_x)(Ba_{1-y}A_y)_2(Cu_{1-z}M_z)_3O_7 \quad (2)$$

wherein R is at least one element selected from the group consisting of Nd, Sm, Eu, Gd, Dy, Ho, Er, Tm, Yb, Lu and Y, A is at least one element selected from the group consisting of Ca, Sr and La, M is at least one element selected from the group consisting of Al, Fe, Co and Ga, and x, y and z are numbers satisfying $0 \leq x \leq 0.2$, $0 \leq y \leq 0.2$ and $0 \leq z \leq 0.1$,
and its crystal particles consisting of flat particles having a broad C plane and having a dimensional ratio of l/d.

wherein l is the value (μm) of a square root of the area of the C plane of the crystal particles, and d is the thickness (μm) of the crystal particles, being at least 8.4, preferably at least 10.

According to this invention, there is further provided a process for the production of a copper oxide superconductor having the composition of formula (1) or (2) which comprises mixing several metal alkoxide solutions corresponding to the formula (1) or (2) in ratios corresponding to formula (1) or (2), hydrolyzing the alkoxides in the mixture in the presence of water, evaporating the sol obtained, and then gel, wherein a copper complex in which a secondary butoxyl group and a hydroxyl group both are coordinated to a copper atom is used as a copper alkoxide.

According to this invention, there is furthermore provided a copper complex in which both a secondary butoxyl group and a hydroxyl group are coordinated with copper atom.

DETAILED DESCRIPTION OF PREFERRED EMBODIMENTS

Figure 1:
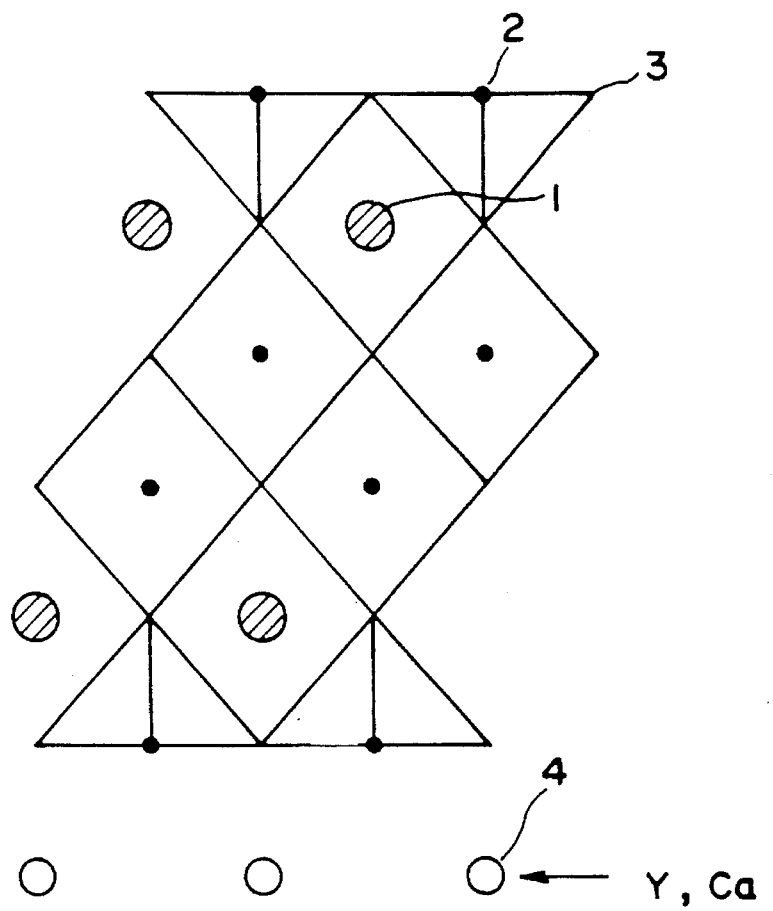
FIG. 1 is a view for illustrating the crystal structure of (Y, Ca).Ba$_2$Cu$_4$O$_8$ of Example 1 of the present invention.
Figure 1:
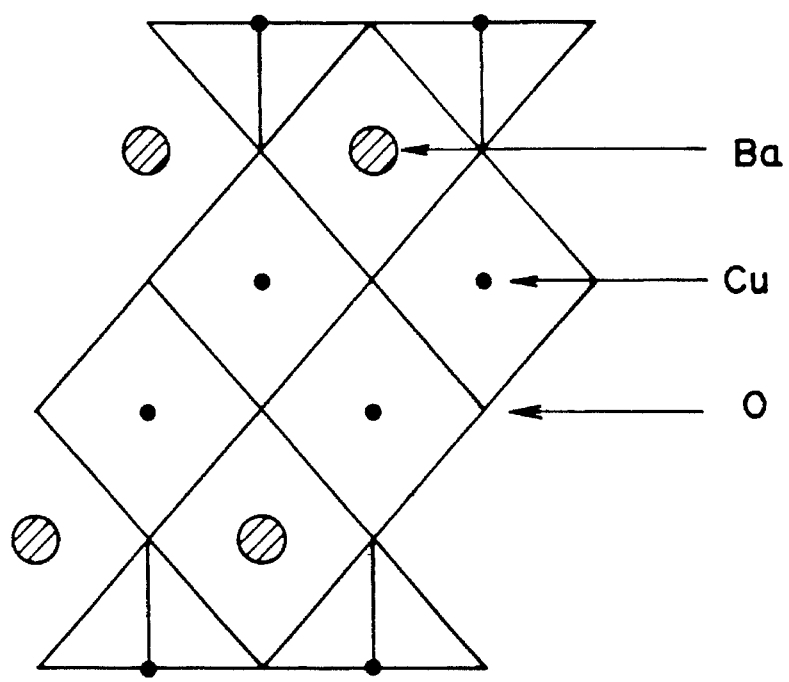

The present invention is based on the discovery that when a 124-type copper oxide superconductor is produced by a sol gel method using alkoxides of the individual constituent metal components, the use of a copper complex in which a secondary butoxyl group and a hydroxyl group are coordinated with a copper atom gives a markedly flat particle-shape copper oxide superconductor as compared with conventional known 124-type or 123-type copper oxide superconductors.

Since the copper oxide superconductors of this invention are composed of flat particles in which the crystal particles have a broad C plane, they have the property of being oriented easily in a fixed direction during molding. Furthermore, the so-obtained molded products have a critical current density larger by one figure than conventional copper oxide superconductors under cooling in liquid nitrogen.

As far as we know, copper oxide superconductors have heretofore not been successfully obtained by the sol gel method using metal alkoxides. According to the present invention, the use of copper complex in which a secondary butoxyl group and a hydroxyl group are coordinated with a copper atom makes it possible to dissolve in a solvent such as alcohols without giving bad influences, such as decomposition, to other metal alkoxides, and can easily decompose with other alkoxides in the presence of water. Thus, a copper oxide superconductor can be produced by the sol gel method.

In addition, the sol gal method can be applied by the present invention. Accordingly, 124-type and 123-type copper oxide superconductors can be synthesized by firing under normal pressure and at a relatively low temperature, for example 750° C. for a relatively short period of, for example, 40 hours. This brings about the advantage that the production procedure is easy and the process is economical.
(Superconductor)

The superconductor of this invention has a 124-type composition of formula (1) or a 123-type composition of formula (2). In these formulae, the R component is composed of a rare earth element and/or yttrium (Y), or a part of the R component may be replaced by Ca. The substitution amount x is in the range of 0 to 0.2. When x exceeds 0.2 but even if the particle shape is flat, the critical current density decreases as compared with those superconductors having x within the above range.

On the other hand, the Ba component in the compositions of formulae (1) and (2) may be existent alone, or may be partly replaced by at least one element A selected from the group consisting of Ca, Sr and La. The substitution amount y may be in the range of 0 to 0.3 in the case of the 124-type, and in the case of the 123-type, y may be in the range of 0 to 0.2. If y exceeds the above upper limit, the critical current density decreases as compared with those superconductors having y within the above range.

Furthermore, in the compositions of formulae (1) and (2), a part of the Cu component may be replaced by at least one element M selected from the group consisting of Al, Fe, Co and Ga. The substituted amount z is in the range of 0 to 0.2 in the case of the 124-type and 0 to 0.1 in the case of the 123-type. If the value of z exceeds the above upper limit, the critical current density markedly decreases as compared with those superconductors wherein z is within the above range.

Figure 3:
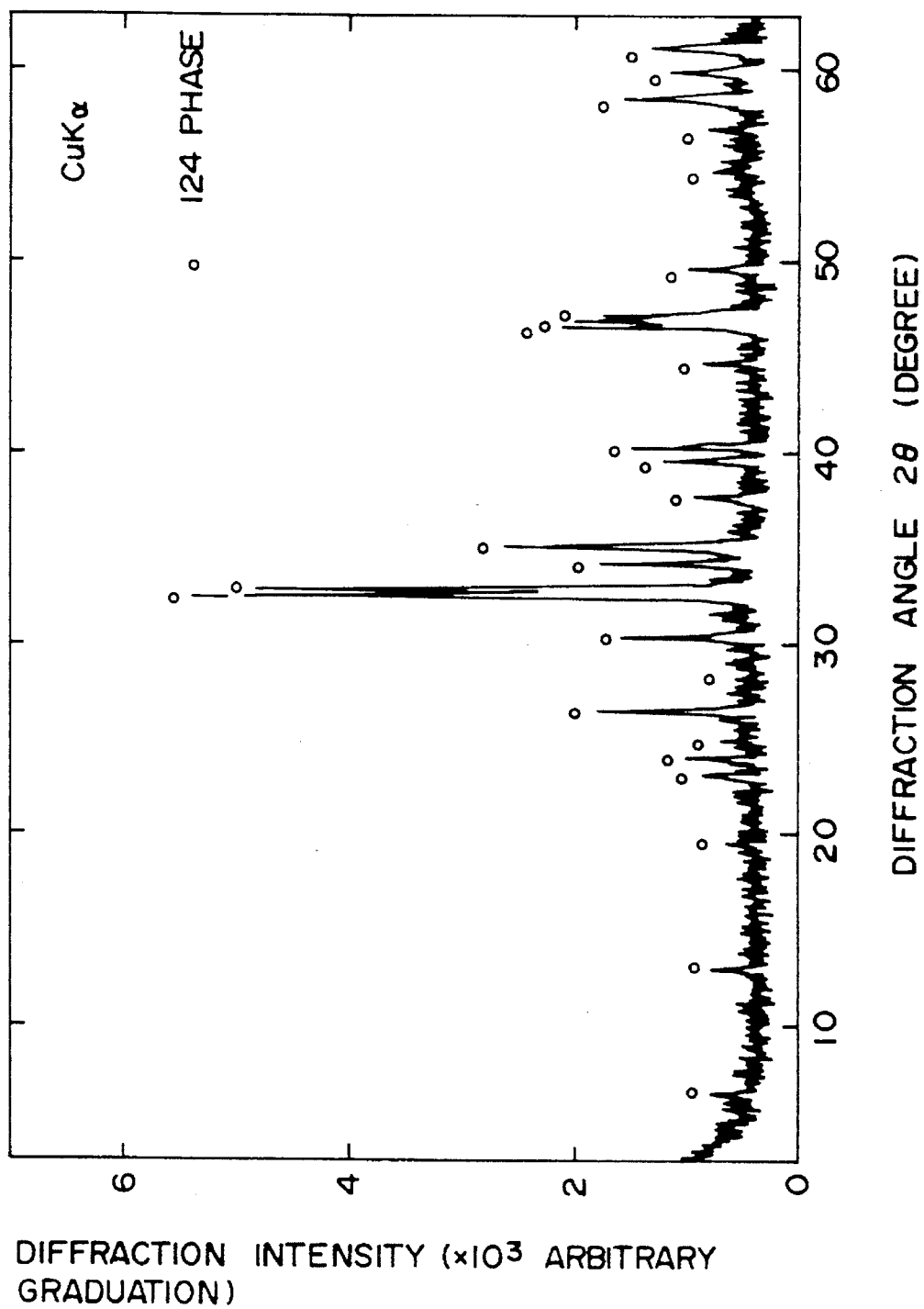
FIG. 3 is a powder X-ray diffraction pattern of a sample obtained by firing $Y_{0.9}Ca_{0.1}Ba_2Cu_4O_8$ of Example 1 of this invention.

One example (Example 1) of the crystal structure of the 124-type superconductor of this invention is schematically shown in FIG. 1. In FIG. 1, 1 represents a Ba atom, 2 represents a Cu atom, 3 represents an oxygen atom on an intersection, and 4 represents a Y atom and/or a Ca atom. The 124-type superconductor of this invention has a crystal structure inherent to the 124-type copper oxide superconductor. FIG. 3 is an X-ray diffraction pattern of one example (Example 1) of the 124-type superconductor of this invention.

Figure 8:
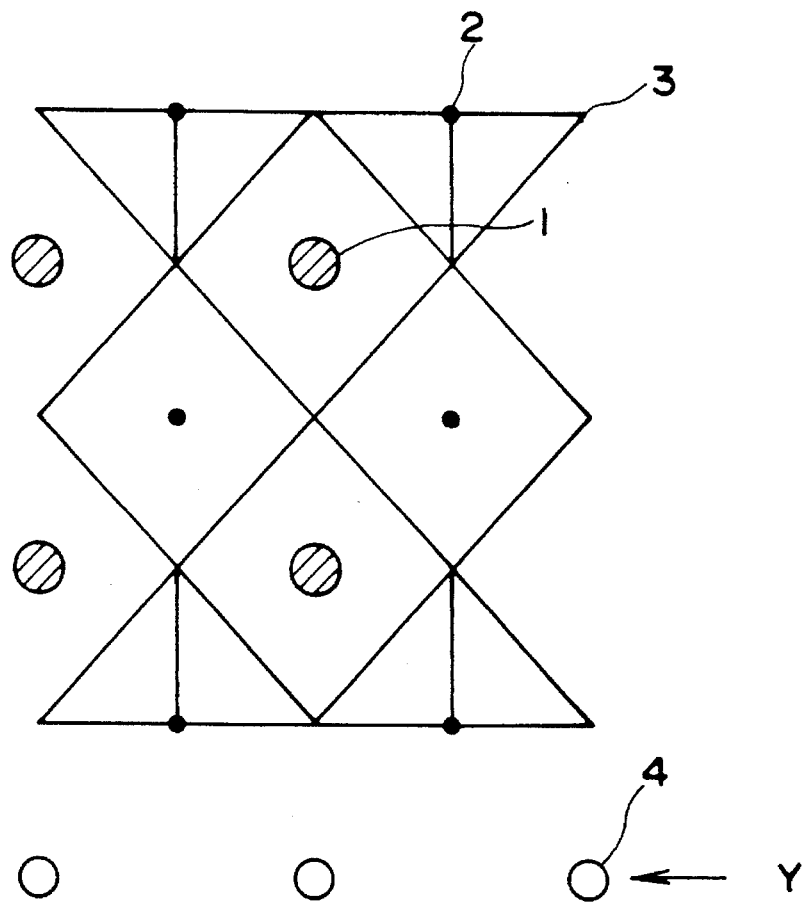
FIG. 8 is a view for illustrating the crystal structure of YBa$_2$Cu$_3$O$_7$ of Example 2 of this invention.
Figure 8:
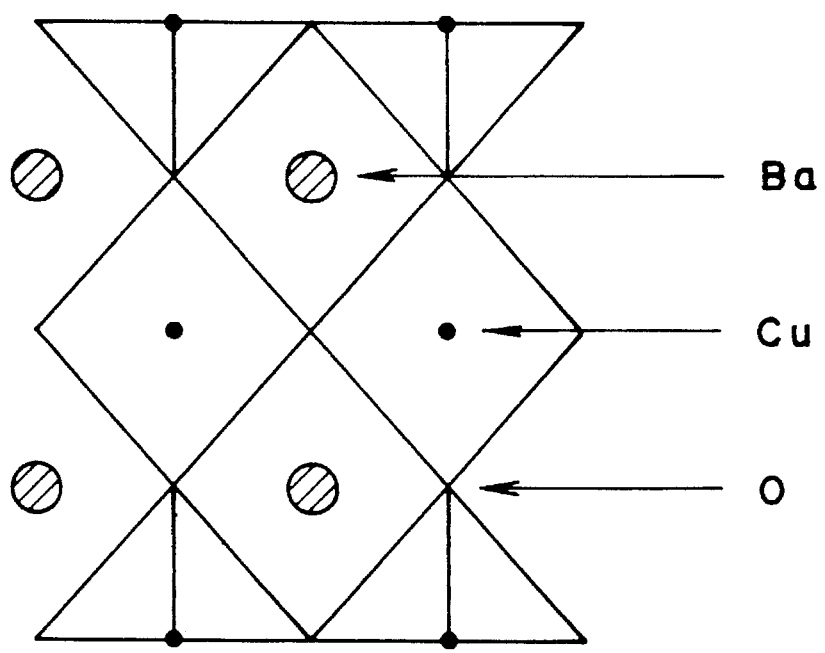
Figure 9:
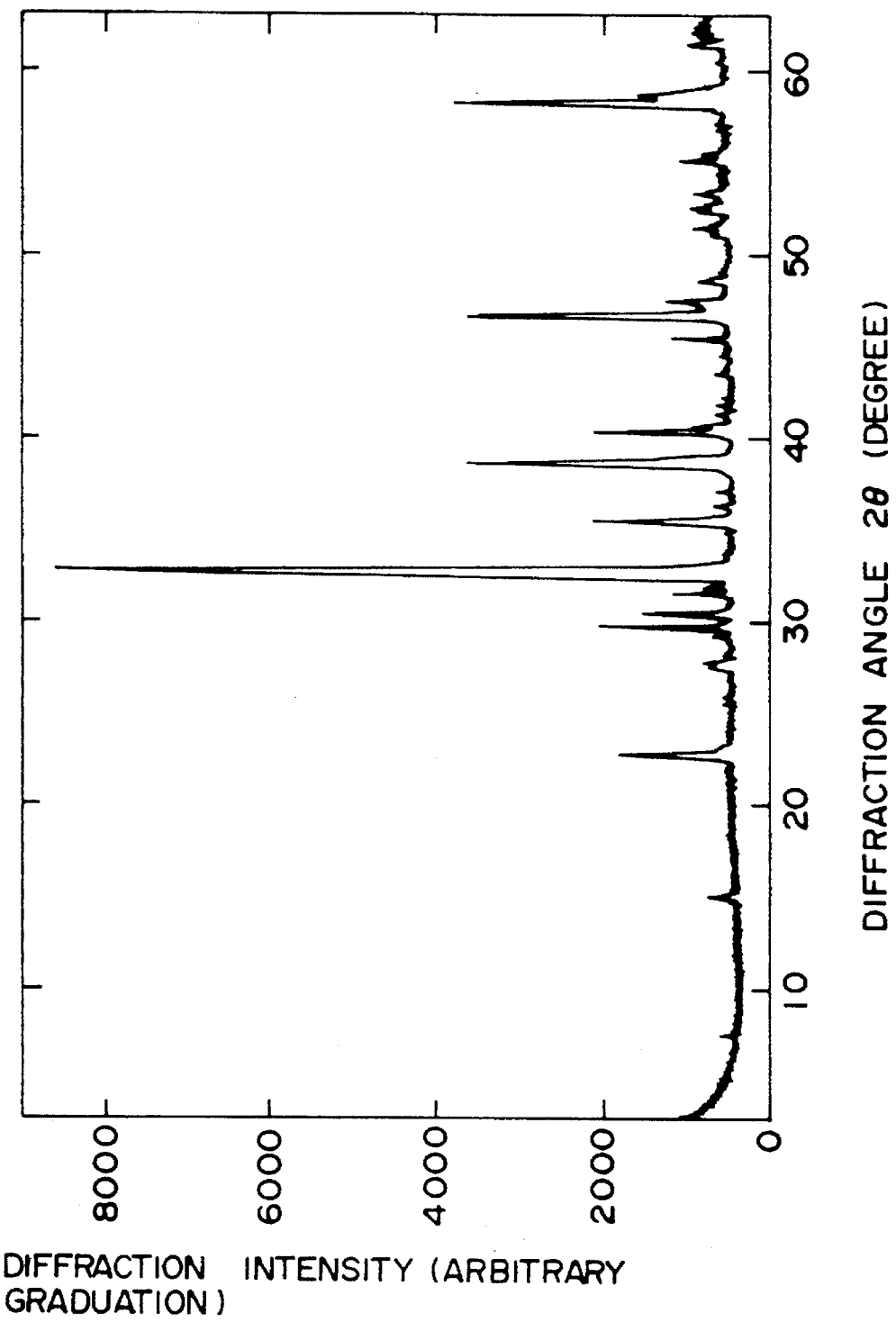
FIG. 9 is a powder X-ray diffraction pattern of YBa$_2$Cu$_3$O$_7$, a 123-type superconductor.

One example (Example 2) of the crystal structure of the 123-type superconductor of this invention is schematically shown in FIG. 8. The symbols in the figure are the same as in FIG. 1. The 123-type superconductor of this invention has a crystal structure inherent to the 123-type superconductor. FIG. 9 is an X-ray diffraction pattern of one example (Example 2) of 123-type superconductor of this invention.

The 124-type and 123-type superconductors of this invention are markedly characterized in that their crystal particles are flat particles having a broad C plane. The fact that the crystal particles are composed of flat particles can be ascertained from a scanning electron microscopic photograph. The degree of the flatness of the crystal particles can be determined by the dimensional ratio of formula (3). The 124-type superconductor of this invention has a dimensional ratio of at least 6.7, preferably at least 10. There is no specific upper limit to the dimensional ratio of the 124-type, but generally it is not more than 71. On the other hand, the 123-type superconductor of this invention has a dimensional ratio of at least 8.4, preferably at least 10. There is no specific upper limit to the dimensional ratio to the 123-type, but generally it is not more than 65. Since the conventional 124-type and 123-type superconductors have a dimensional ratio of about 1.3 to about 1.4, the superconductors of this invention are flat particles having a markedly grown C plane.

Figure 7:
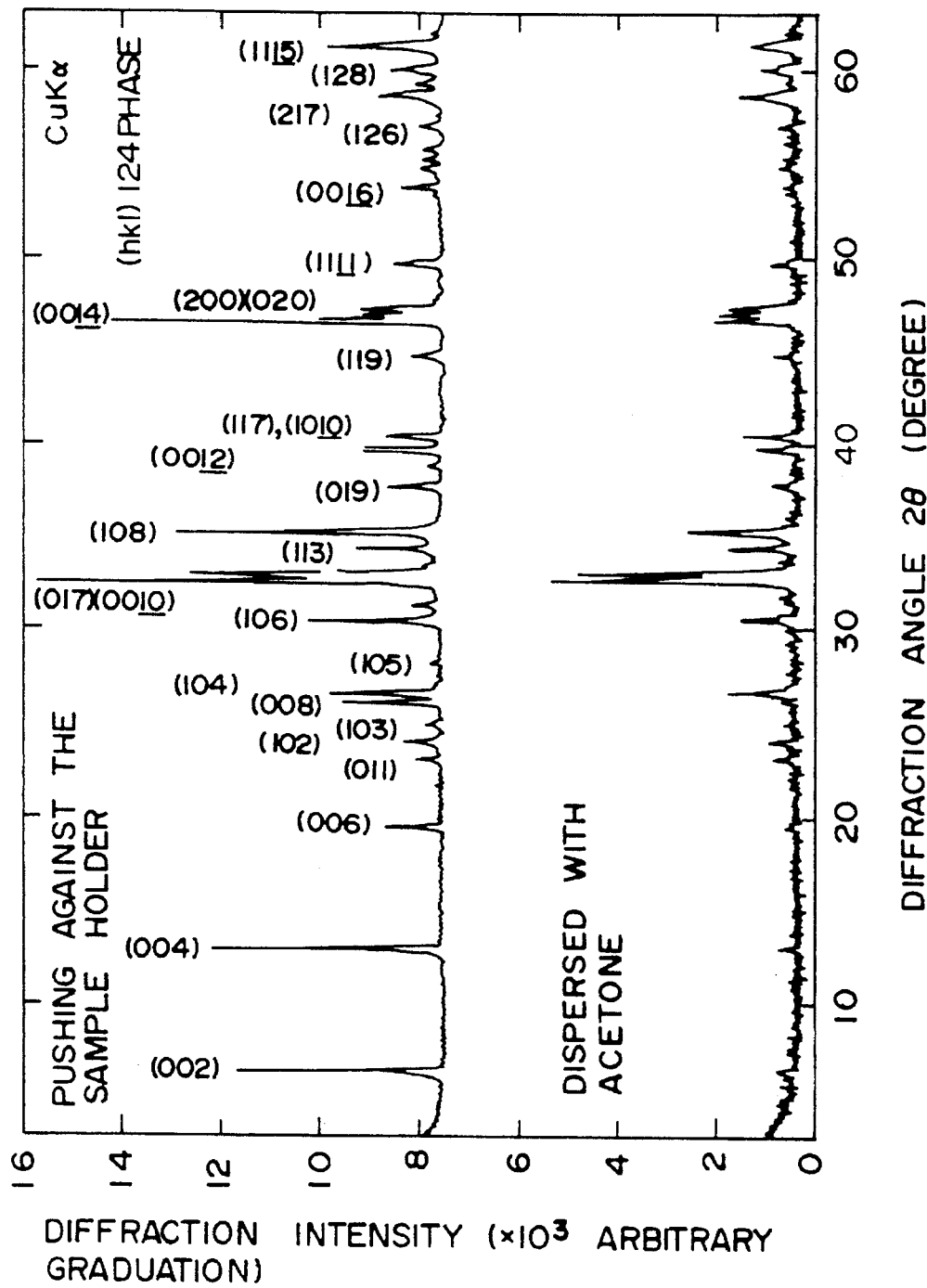
FIG. 7 shows X-ray diffraction patterns when a powder of a sample obtained by firing $Y_{0.9}Ca_{0.1}Ba_2Cu_4O_8$ of Example 1 is pressed against the sample holder, and is dispursed in acetone at random on the sample holder.

Since the superconductors of this invention are flat particles having a grown C plane, they show an excellent action in that they are oriented in a fixed direction by a mechanical force. This particle orientation can be ascertained by an X-ray diffraction. FIG. 7 shows X-ray diffraction images of particles of a 124-type superconductor pressed against the surface of the sample holder, and those dispersed in acetone at random. Since the particles to which a force is exerted leaves a peak corresponding to the index of a plane (00 1) is very strong as compared with the particles dispersed in acetone at random, a flat surface of the crystal particles is a C plane and orientation takes place in the direction of the plane. This is the same with regard to the 123-type superconductor.

It is immediately clear from Table 1 (124-type) and Table 7 (123-type) to be described later that the particle shape and the dimensional ratio are very important in increasing the critical current density ratio.

Since any of the 124-type and 123-type superconductors of this invention has a superconductivity transition initiating temperature Tc (on) and a zero resistance temperature Tc(R=9) in a temperature range higher than the liquid nitrogen temperature (77° K.), the invention has an advantage in that under cooling in liquid nitrogen, they can be used as good superconductors. Tc(R=0) generally is 80° K. to 95° K.

The particles of 124-type and 123-type superconductor particles in accordance with this invention can be fabricated into any products such as wires, tapes, films, and thin plates. At this fabrication, flat particles are oriented in a fixed direction, and therefore, they have superior superconductivity characteristics. In molding, the particles are coalesced to each other by firing them. Molding and firing may be simultaneously performed in a hot press, etc. Or molding is first carried out and then the product may be fired at normal pressure or at an elevated pressure. In molding, powders alone may be molded at an elevated pressure. A molding adjuvant such as a wax or a thermally decomposable resin may be used. Sintering may be carried out at a temperature of 600° to 900° C. The sintering atmosphere is preferably an atmosphere containing oxygen.
(Production of a superconductor)

According to this invention, a copper complex in which a secondary butoxyl group and a hydroxyl group are both coordinated with a copper atom is mixed with other metal alkoxides in a solution in a quantitative ratio satisfying the formula (1) or (2), hydrolyzing the alkoxides in the mixture in the presence of water, drying the resulting gel and then firing it to form a superconductor.

Most preferably, the copper complex contains a secondary butoxyl group and a hydroxyl group in a mole ratio of about 1:1.

The copper complex may be synthesized by various methods as shown below, for example, by (1) a method comprising reacting sec-butoxide of an alkali metal or an alkaline earth metal and an alkali metal or alkaline earth metal hydroxide in an organic solvent with a copper salt soluble in an alcohol used as a solvent, and (2) a method comprising partially hydrolyzing copper sec-butoxide in a solvent with water.

Examples of the copper salt include inorganic acid salts such as copper chloride and copper nitrate and organic acid salts such as copper acetate. The use of copper chloride is preferred because it gives a copper complex solution having a high concentration. Secondary butanol is preferred as the organic solvent. But other alcohols such as n-butanol and isopropanol may also be used.

When the copper salt is reacted with sec-butoxide and a hydroxide, the reaction according to the following formula proceeds

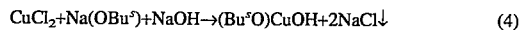

$$CuCl_2 + Na(OBu^s) + NaOH \rightarrow (Bu^sO)CuOH + 2NaCl\downarrow \quad (4)$$

and a copper compound in which a hydroxyl group and a sec-butoxyl group (sec-BuO) are coordinated is formed.

This copper complex is soluble in a solvent such as sec-butanol, and in the presence of another metal alkoxide, the alkoxide is not decomposed but remains stable. When water is added to this copper complex, it is immediately decomposed to precipitate.

Copper sec-butoxide used in the partial hydrolysis is formed by reacting an equivalent weight (2 mole times), based on the copper salt, of an alkali metal or alkaline earth metal sec-butoxide. This product is insoluble in the above-mentioned solvent and is obtained in the form of a suspension. By adding an equivalent amount of water, it is partially hydrolyzed to form the copper complex of the present invention. A solution dissolved in a solvent is obtained.

As the other metal alkoxides, it is possible to use alkoxides of the constituent metal components of formula (1) or (2), such as sec-butoxide, n-butoxide, tert-butoxide, isopropoxide and n-propoxide.

A solution of the metal alkoxide and a solution of the copper complex of this invention are mixed in a composition ratio shown in formula (1) in the case of the 124-type or in a composition ratio shown in formula (2) in the case of the 123-type. The mixing procedure may be carried out in an inert atmosphere to avoid the mixing of water. Mixing may be performed at room temperature, but to make it possible to effect intimate mixing, the mixing is generally carried out at a temperature of 4° to 70° C. for a period of about 2 to 20 hours.

The mixture may be gradually hydrolyzed by introducing air (air containing water) thereinto. The hydrolysis is desirably carried out at a temperature of 40° to 70° C. To obtain a gel powder, the resulting sol liquid is dried by heating under reduced pressure. The gel powder is further dried at 200° to 500° C. under reduced pressure.

According to this invention, this powder is heat-treated at a relatively low temperature of 600° to 900° C. for a period of at least 1 hour, expecially 2 to 40 hours. This is a relatively short heat-treatment for the synthesis of copper oxide superconductors to produce almost single crystalline phase of a 124-type or 123-type copper oxide superconductor.

The following Examples illustrate the present invention.

Synthesis Example 1

The chemical properties and chemical compositions of the copper complexes obtained by the methods of Synthesis Examples 1 and 2 will be illustrated. In the synthesis of the copper complex in Synthesis Example 1, cupric chloride, sodium secondary butoxide and sodium hydroxide were subjected to an induction group exchange reaction in secondary butanol.

The resulting suspension was centrifuged for eliminating NaCl to obtain a butanol solution of a copper complex. The existence of NaCl in the removed solid was confirmed by X-ray diffractometry. It was found that an exchange reaction occurred among chlorine of cuptic chloride and a secondary butoxyl group or a hydroxyl group. The solution assumed a deep green color. As a result of an inductively coupled spectroscopy (ICP), the concentration of the solution as copper was 0.05M (mole/liter). To examine whether this solution decompose other alkoxides, a solution of the copper complex was added to a butanol solution which dissolved three butoxides of Y, Ca and Ba. The mixed solution did not become turbid, and it was found that the Copper complex formed by the synthesizing method of Synthesis Example 1 does not decompose other alkoxides.

When water was added to a solution of the copper complex, the solution instantaneously became suspended. On centrifugal separation, it separated into a deep green solid and a transparent solvent. It was found by an ICP that a copper component was not existent in the transparent solvent.

It is seen from the above results that the copper complex was dissolved in a butanol solvent in a concentration of about 0.05M, did not decompose other alkoxides, and was hydrolyzed by adding water, and this is useful for the sol gel method.

In the above synthesizing method, for one atom of Cu, the total of sodium secondary butoxide and sodium hydroxide was two atoms, and the ratio of sodium secondary butoxide and sodium hydroxide was varied. As a result, if the ratio of sodium hydroxide is 0, the concentration of Cu in the solution is almost 0 (below the delection limit). When the proportion of sodium hydroxide based on the total amount is from 0 to 0.5, the concentration of Cu in the solution is almost identical with the equivalent weight of sodium hydroxide and increases linearly. Between 0.5 and 1, it is almost identical with the equivalent weight of sodium secondary butoxide, and decreases linearly. When the proportion of sodium hydroxide is 1, the concentration of Cu in the solution becomes almost 0. From this, in the reaction used in the synthesis, the group exchange reaction of cupric chloride, sodium secondary butoxide, and sodium hydroxide proceeds as described in formula (4) above. Accordingly, the copper complex formed in Synthesis Example 1 is considered to results from coordination of a secondary butoxyl group and a hydroxyl group to a copper atom.

Synthesis Example 2

Synthesis from various copper compounds will be illustrated.

(A) Copper nitrate

A part of water of crystallization was removed from copper nitrate trihydrate to make about monohydrate of copper nitrate which was dissolved in secondary butanol. To the resulting bright blue solution, a solution of an equivalent (2 times) mole, based on copper, of sodium secondary butoxide was added. The mixture was stirred and mixed. The solution changed from blue to deep green at the moment of mixing, and was suspended. The solution after centrifugal separation was a deep green color. As a result of an ICP, the concentration of the copper component was 0.02M. When water was added to this solution, it separated into a transparent solvent and a deep green solid.

(B) Copper acetate monohydrate

Copper acetate monohydrate was dissolved in secondary butanol. The solubility was low, but a part of the copper compound was dissolved to form a blue solution. To the solution a butanol solution of an equivalent mole, based on copper, of sodium secondary butoxide was added. They were mixed with stirring. The solution, at the moment of mixing, changed from a blue color to a brown color, and was suspended. After centrifugal separation, the solution was brown. An ICP showed that the concentration of the copper component was 0.005M. When water was added to this solution, it separated into a transparent solvent and a brown solid.

(C) Copper acetate anhydride

Copper acetate monohydrate was dried at 100° C., and a powder changing from a blue green color to a black color was dissolved in secondary butanol. The solubility was low, but a part of the powder was dissolved to obtain a green solution. A butanol solution of a half equivalent mole, based on copper, of sodium secondary butoxide and a half equivalent mole, based on copper, of sodium hydroxide was added to this solution, and they were mixed with stirring. The solution, at the moment of mixing, changed from a green color to a brown color, and was suspended. After centrifugal separation, the solution was brown. ICP showed that the concentration of the copper component was 0.004M. When water was added to this solution, it separated into a transparent solvent and a brown solid.

The above results showed that the copper compounds used for the synthesis of the copper complexes may be those which develop an exchange reaction of a group in a solvent. Water of crystallization, if present in a half equivalent mole based on copper, will be useful for the formation of copper complexes.

Synthesis Example 3

This Example illustrates the synthesis of a copper complex using various metal secondary-butoxides and hydroxides.

By the method of Synthesis Example 1, sodium secondary butoxide and a hydroxide were replaced by lithium, barium and strontium secondary butoxides and hydroxides. In any case, a solution of a copper complex having about 0.05 mole (M) of copper was obtained. When water was added to this solution, it separated into a transparent solvent and a brown solid.

From these results, it was found that secondary butoxide and a hydroxide may be those which developed an exchange reaction of a group with a copper compound in a solvent.

Synthesis Example 4

Synthesis using partial hydrolysis of copper secondary butoxide will be illustrated.

A secondary butanol solution of copper chloride was mixed with a secondary butanol solution of sodium secondary butoxide to obtain a suspension of copper di-secondary butoxide and NaCl. A part of the suspension was taken out, and as a result of centrifugal separation, the suspension separated into a clear solvent and a green solid. An ICP showed that almost no Cu was present in the transparent solvent. On the other hand, when a half equivalent mole of water was added to the suspension, and they were mixed with stirring, Cu dissolved in a concentration of 0.03M in the solution after centrifugal separation. When water was added to this solution, it separated into a transparent solvent and a brown solid.

From this result, the copper complex of this invention can also be synthesized by first synthesizing copper secondary butoxide and then partly hydrolyzing the resulting product.

EXAMPLE 1

Figure 2:
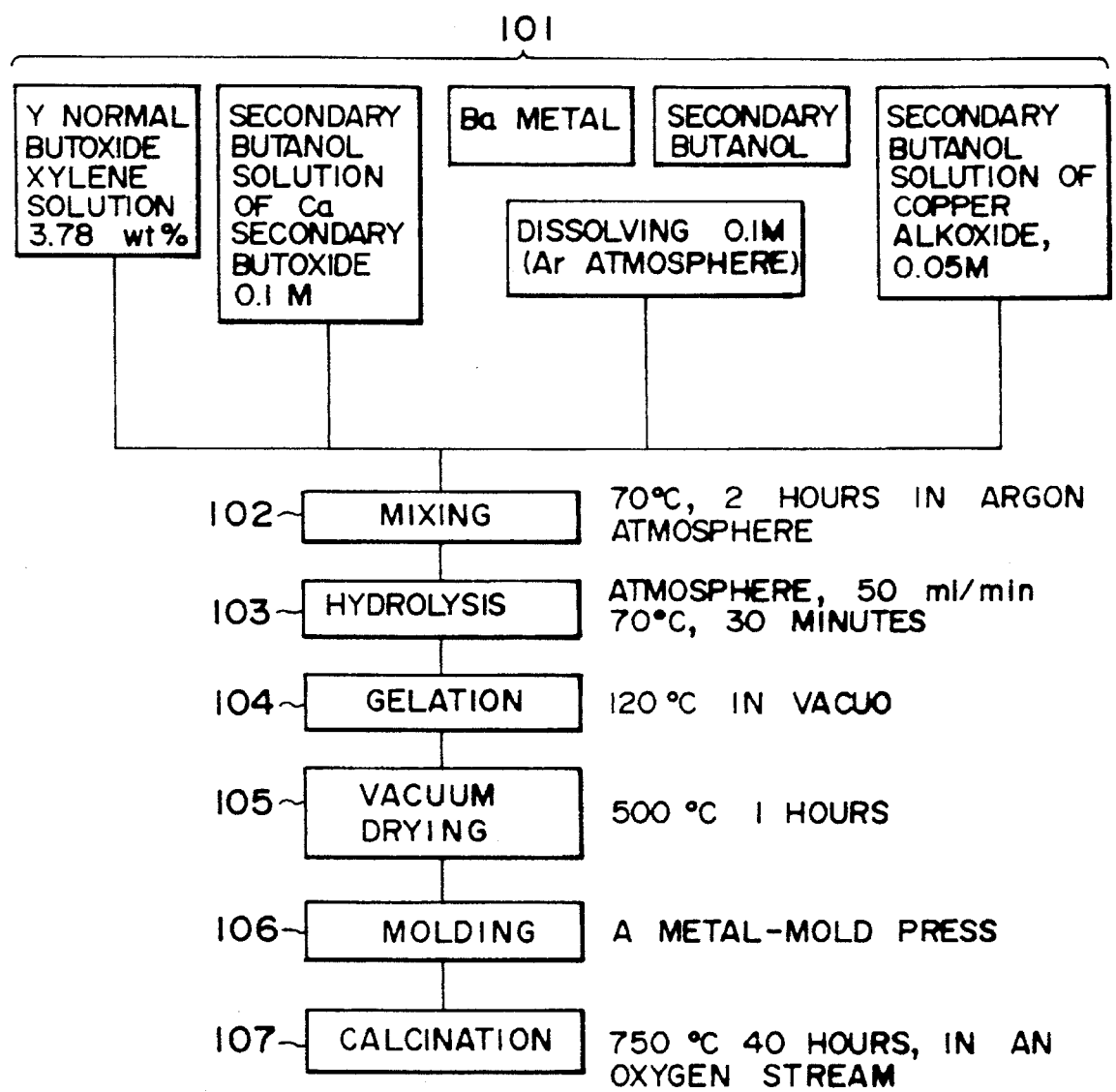
FIG. 2 is a flow chart of Example 1 for the synthesis of a 124-type superconductor of this invention.

In accordance with the flow chart shown in FIG. 2, a 124-type copper oxide superconductor was produced.

A butanol solution of a copper alkoxide in which a secondary butoxyl group and a hydroxyl group were coordinated with a copper atom and three solutions of Y butoxide, Ca butoxide and Ba butoxide were measured so that Y:Ca:Ba:Cu became 0.9:0.1:2:4 (step 101). The solutions were mixed at 70° C. in an argon atmosphere for 20 hours (step 102). Indoor air was introduced into this solution at a flow rate of 50 ml/min. for 30 minutes to perform hydrolysis (step 103). The suspended liquid was evaporated to dryness at 120° C. under vacuum (step 104). The resulting gel powder was dried for 1 hour at 500° C. under vacuum to form a dried powder (step 105). The dried powder was molded in a metal mold (step 106). The molded product was fired at 750° C. in an oxygen stream for 40 hours (step 107).

FIG. 3 shows a powder X-ray diffraction pattern of the sample fired as above. It is seen from FIG. 3 that the fired sample shows a sharp diffraction peak by the 124 phase, and a diffraction peak ascribable to an impurity phase was hardly recognized.

Figure 4A:
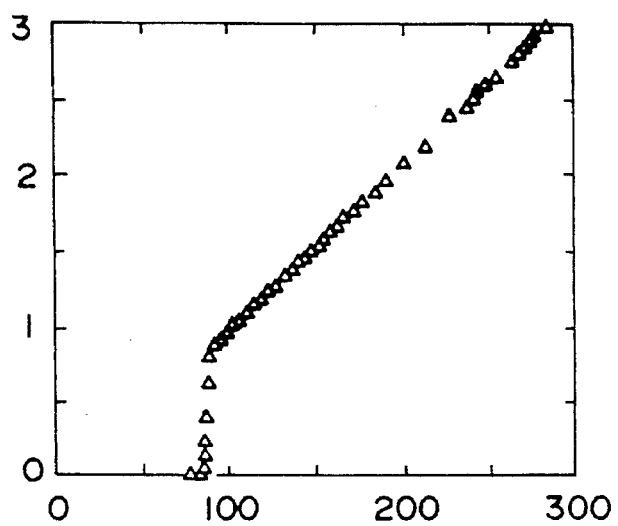
FIG. 4 is a resistance-temperature characteristic graph of a sample obtained by firing $Y_{0.9}Ca_{0.1}Ba_2Cu_4O_8$ of Example 1 of this invention.
Figure 4B:
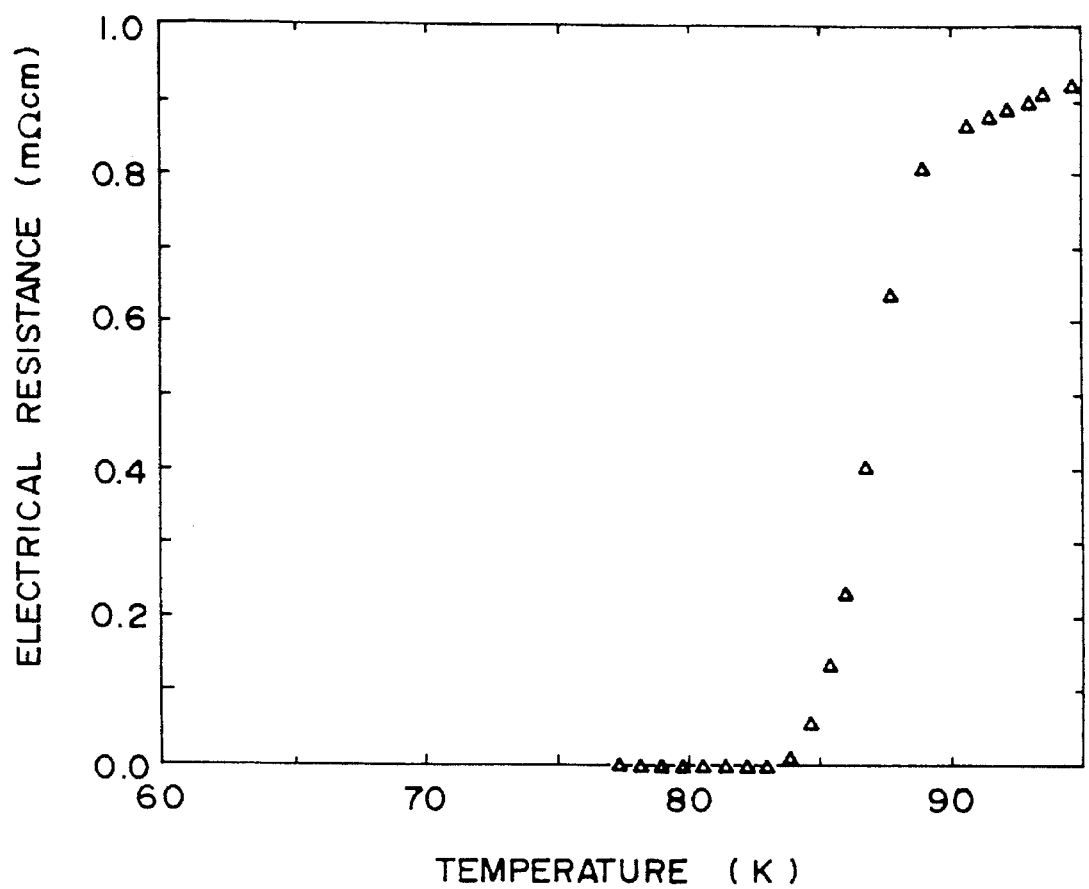

FIG. 4 shows a temperature dependence of the electric resistivity of the sample. It is seen from FIG. 4 that this sample sharply transferred in superconductivity at a high temperature of Tc(on)=89 K. and Tc(R=0)=84 K.

Figure 5A:
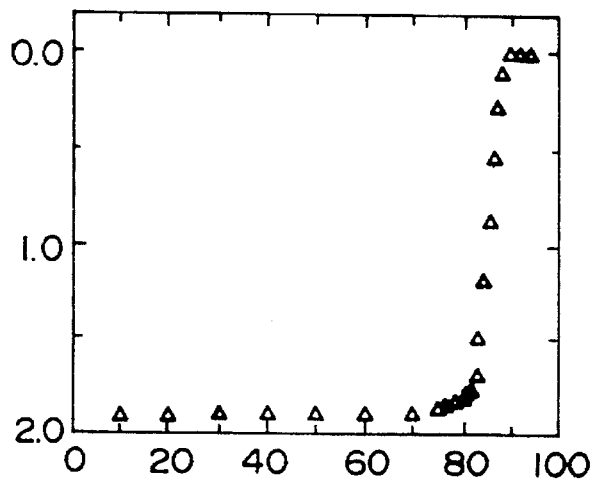
FIG. 5 is a magnetic susceptibility-temperature characteristic graph of a sample obtained by firing $Y_{0.9}Ca_{0.1}Ba_2Cu_4O_8$ of Example 1 of this invention.
Figure 5B:
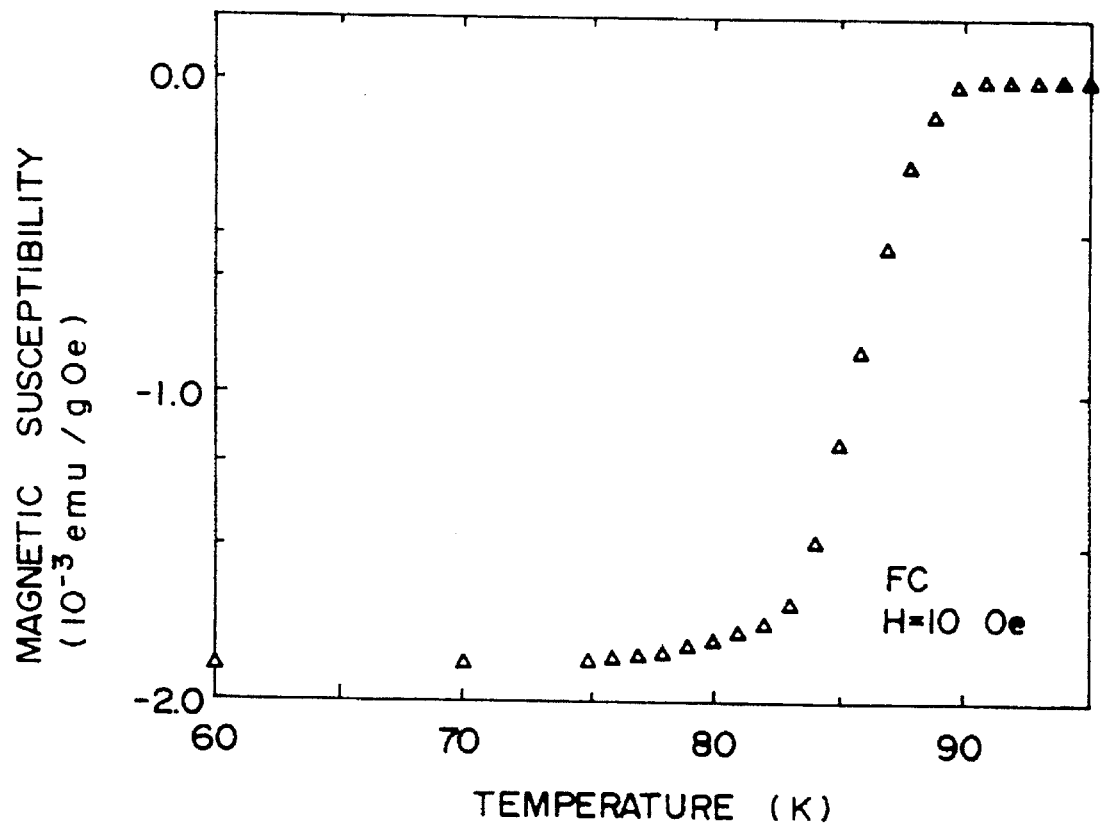

FIG. 5 shows a temperature dependence of the magnetic susceptibility of the sample. This sample shows a sharp superconductivity transfer from a magnetically high temperature Tcmag(on)=90 K. In conjunction with the results of the X-ray diffraction, and the temperature dependence of an electric resistivity, it is seen that this sample is of almost a single 124 phase having good crystallinity.

Figure 6:
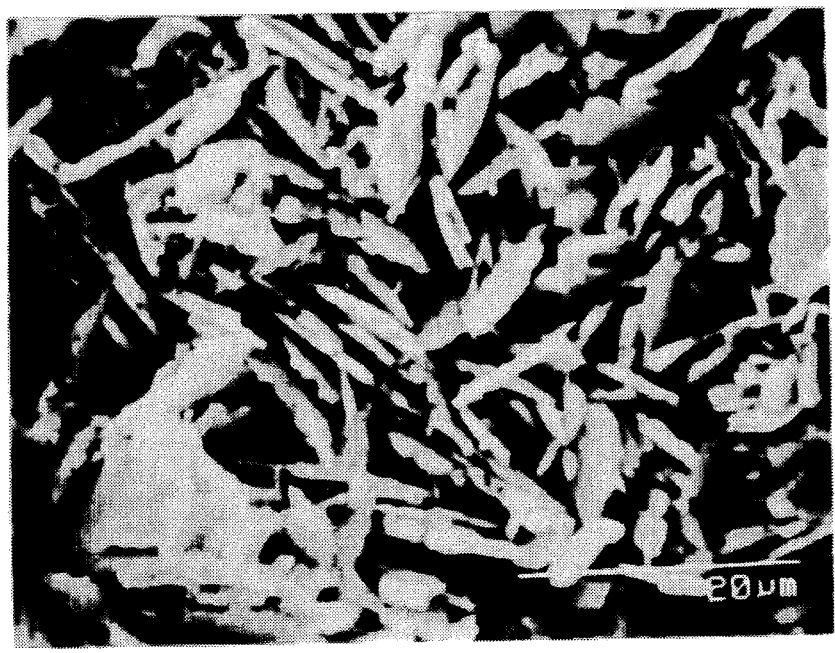
FIG. 6 is a SEM photograph of a fractured surface of a sample obtained by firing $Y_{0.9}Ca_{0.1}Ba_2Cu_4O_8$ of Example 1 of this invention.

FIG. 6 shows a scanning electron microscopic (SEM) photograph of the fractured surface of a sample fired at 750° C. From this photograph, it is seen that the particles of this sample were flat. The particles contained a flat surface having an area of about 15 µm×15 µm on an average. The thickness was 0.3 µm. To examine what this flat surface is crystallographically, the sample was crushed. The powder was pressed against the hollow of a glass sample holder and subjected to an ordinary powder X-ray diffractometry (θ–2θ scan). For the sake of reference, the same powder was dispersed at random in acetone, and fixed to a sample holder, and subjected to the same powder X-ray diffractometry.

FIG. 7 shows the results obtained. The sample pressed against the hollow of the sample holder showed a very strong peak of the 124 phase (00 l) as compared with the sample dispersed at random in acetone. This result shows that the flat surface of the 124-type superconductor flat particles was C plane in the same way as in the flat particles of a Bi-based superconductor.

EXAMPLE 2

Example 2 directed to a method of synthesizing a 123-type superconductor of this invention and the superconducting properties and particle shape of the 123-type superconductor prepared by Example 2 will be illustrated.

The synthesizing method of the 123-type superconductor of Example 2 was the same as the method of Example 1. A butanol solution of a copper alkoxide in which a secondary butoxyl group and a hydroxyl group are coordinated with a copper atom and two solutions of Y butoxide and Ba butoxide were measured so that Y:Ba:Cu became 1:2:3, and they were mixed at 70° C. for 20 hours in an argon stream. Indoor air was introduced into the solution at a flow rate of 50 ml/min. for 30 minutes to perform hydrolysis. The suspended solution was evaporated to dryness at 120° C. under vacuum. The resulting gel powder was dried in vacuum at 500° C. for 1 hour to form a dry powder. The dry powder was molded in a metal mold, fired for 40 hours at 600° C. in an argon stream, and thereafter annealed at 500° C. in an oxygen stream for 5 hours.

FIG. 9 shows a powder X-ray diffraction pattern of the sample fired in Example 2.

Figure 10A:
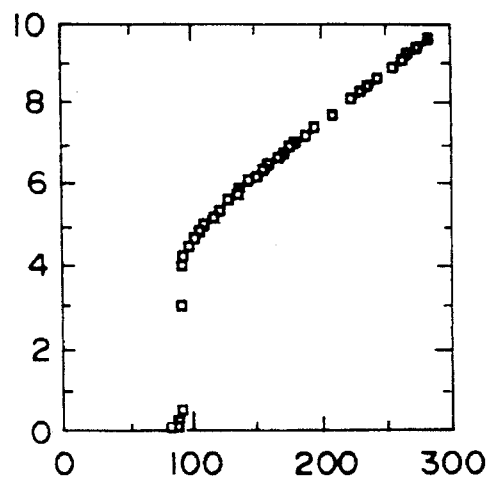
FIG. 10 is a resistivity-temperature characteristic graph of a sample obtained by firing YBa$_2$Cu$_3$O$_7$ of Example 2 of this invention.
Figure 10B:
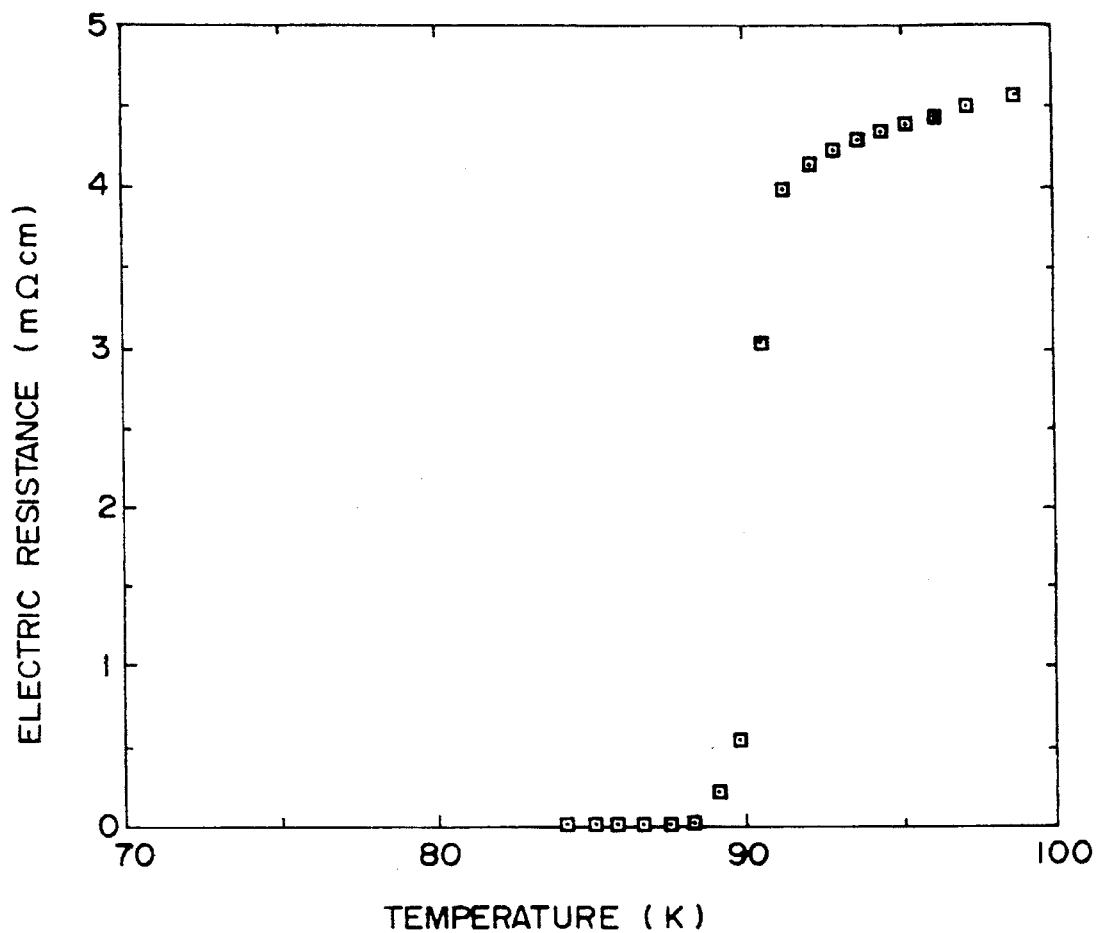

FIG. 10 is a graph showing the temperature dependence of the electrical resistivity of this sample. It is seen from FIG. 10 that the sample was transferred in superconductivity sharply at a temperature as high as Tc(on)=91 K. and Tc(R=0)=88 K. It is seen from the results that this sample was a single 123 phase having good properties as a superconductor.

When a fractured surface of this sample was observed by SEM, the particles were flat and the flat surface of the particles had an area of about 14 μm×14 μm with a thickness of 0.3 μm. To examine what this flat surface is crystallographically, the sample was crushed as in Example 1, and the powder was pressed against the hollow of a glass sample holder and subjected to an ordinary powder X-ray diffractometry (θ–2θ scan). The same powder was dispersed in acetone at random and fixed to the sample holder, followed by measurement. The powder pressed against the hollow of the glass sample holder had a very high peak of the 123 phase (00 l) as compared with the powder dispersed in acetone at random. From this result, it is seen that the flat surface of the 123-type superconductor flat particles was a C plane similarly to the Bi-based superconductor or the Y-based 124 superconductor of Example 1. The zero resistance temperature of this superconductor was as high as 88 K., and good properties as a superconductor were obtained at a liquid nitrogen temperature.

EXAMPLE 3

A synthesizing method of the 124-type and 123-type superconductors and the superconductor properties and particle shape of the 124-type and 123-type superconductors prepared in Example 3 will be illustrated.

In Example 3, the solution of the starting materials of Y, Ca and Ba were changed to propanol solutions of the respective propoxides, and a 124-type superconductor having the same composition as in Example 1 and a 123-type superconductor having the same composition as in Example 2 were prepared by the synthesizing methods of Example 1 and Example 2. The temperature dependence of the electrical resistivity was measured, and the superconductivity transition temperature was Tc(on)=89 K. and Tc(R=0)=81 K. for the 124-type superconductor, and Tc(on)=92 K. and Tc(R=0)=86 K. for the 123-type superconductor.

By the results of observation of the fractured surfaces of the resulting samples by SEM, the crystal particles of the 124-type superconductor and the 123-type superconductor according to Example 3 were flat particles as in Example 1 and Example 2. As in Examples 1 and 2, the powder was pressed against the hollow of a glass sample holder, and subjected to an ordinary powder X-ray diffractometry (θ–2θ). It was found that in the same way as in the powders of Examples 1 and 2, a peak (00 l) of the 124-type superconductor and the 123-type super conductor was strong, and the broad surface of the flat particles was a C plane. This results shows that the 124-type and 123-type superconductors of flat particles can be synthesized by the sol gel method using metal alkoxides.

EXAMPLE 4

A thin plate of a 124-type superconductor of this invention and a method of preparing it will be illustrated.

(A) The Ca-containing 124-type superconductor obtained by the method of Example 1 and a 124-type superconductor prepared by a high pressure method were crushed under various conditions to form powders. Each was fabricated in a mold press to form thin plate-like molded articles having a width of 3 mm and a thickness of 0.5 to 1 mm. These molded articles were heat-treated at 700° C. for 10 hours for coalescing particles with each other to form the plates of superconductors. To decrease a sectional area for the flowing of an electric current, a cut was formed in a central portion. They are put in a liquid nitrogen, and a critical current density was measured by an ordinary four-probe method. The results are shown in Table 1. The critical current density is higher as the dimensional ratio in Table 1 is larger, and especially when the dimensional ratio is at least 10, the effect of an increase of critical current density is marked and the sample showed a critical current density at least 10 times that of the sample prepared by the high pressure method.

The critical current density of the sample prepared by using the 124-type superconductor in the form of flat particles having a dimensional ratio of 6.7 was 8 times the sample prepared by the high pressure method. The degree of the flatness of the particles was calculated by using an average particle dimension estimated from an by SEM photograph of the crushed powder, and described in the dimensional ratio in Table 1. Particles of the sample prepared by the high pressure method were shown by SEM observation to be culumnar having a size of about 3×3×5 μm$^3$, and the degree of flatness was the ratio of the square root of the maximum area (3×5 μm$^2$) to the minimum length (3 μm) and the dimensional ratio was estimated to be 1.3. These results show that in the 124-type superconductor, by making the shape of the particles flat, especially by providing the square root of the area of the C plane to the thickness in the C direction at least 6.7, a superconductor thin plate having a critical current density at least 8 times larger than when particles which were not flat were used.

TABLE 1

| Outside the invention marked * | Sample No. | Synthesis method | Crushing method | Particle dimension[2] [C plane area × Thickness of C plane] ($\mu m^3$) | Dimensional ratio[3] | Critical current density[4] (A/cm$^2$) |
|---|---|---|---|---|---|---|
| * | 1 | High pressure method[1] | Mortar | 15 × 3 | 1.3 | 150 |
|   | 2 | Sol gel method | None | 210 × 0.3 | 48 | 2900 |
|   | 3 | Sol gel method | Mortar | 35 × 0.3 | 20 | 2500 |
|   | 4 | Sol gel method | Mortar | 19 × 0.3 | 15 | 2000 |
|   | 5 | Sol gel method | Ball mill | 4.2 × 0.2 | 10 | 1700 |
|   | 6 | Sol gel method | Ball mill | 1.8 × 0.2 | 6.7 | 1200 |

Note:
[1] Using a gaseous mixture composed of 20% of oxygen and argon, the synthesis was carried out at a total pressure of 2000 atmospheres.
[2] An average dimension of particles estimated from an SEM photograph of the powder.
[3] The dimensional values used in 2) were used. (C plane area)$^{1/2}$/(thickness of C plane).
[4] Measured by actually flowing a current in the sample in liquid nitrogen.

(B) In the above process, y is limited to 9, z is limited to 0 in a chemical formula $(R_{1-x}Ca_x)(Ba_{1-y}A_y)(Cu_{1-z}M_z)_4O_8$, R is replaced by various elements, and the amount of Ca was varied, and by the same method as above, a thin plate was produced. The critical current density was measured at 77° K. The results are shown in Table 2. In the numerals of Table 2, the first term is a critical current density at a liquid nitrogen temperature, and the second term is a dimensional ratio of the powder particles used. In the case of one type of La, Ce or Pr, a 124-type superconductor was not formed. The critical current density increases as the x as the amount of Ca becomes large, but decreases as the x becomes 0.3. A powder in which x becomes x=0.3 becomes a large peak of impurities than when x is smaller by X-ray diffraction. Since the effective sectional area through which a superconducting current flows, the critical current density is considered to become small. Dependence of an R element is that when the x and the dimensional ratio are about the same, the critical current density is larger as the ion radius of R is smaller. When R is composed of a plurality of elements, the use of an average ion radius gives the same behavior. Dependence of the dimensional ratio is that when the composition is the same, the critical current density is larger as the dimensional ratio is larger.

TABLE 2

| R | X |  |  |  |
|---|---|---|---|---|
|   | 0 | 0.1 | 0.2 | 0.3 |
| Y | 880/16 | 1500/12 | 810/16 | 60/12 |
|   | 1100/22 | 1800/33 | 1200/24 | 130/35 |
|   | 1400/71 | 2400/45 | 1300/36 | 200/52 |
| Nd | 930/56 | 1800/50 | 1100/42 | 130/46 |
| Sm | 1000/52 | 2000/48 | 1600/42 | 120/50 |
| Eu | 1000/47 | 1800/46 | 1700/49 | 150/41 |
| Gd | 1100/41 | 1700/43 | 1700/59 | 120/44 |
| Dy | 1200/47 | 2000/60 | 1500/45 | 120/38 |
| Ho | 1300/52 | 2200/40 | 1800/54 | 150/45 |
| Er | 1300/42 | 2400/56 | 1800/48 | 120/40 |
| Tm | 1300/45 | 2400/40 | 2300/51 | 150/35 |
| Yb | 800/39 | 2000/37 | 1700/34 | 100/28 |
| Lu | 700/45 | 1400/28 | 1500/33 | 130/25 |

TABLE 2-continued

| R | X |  |  |  |
|---|---|---|---|---|
|   | 0 | 0.1 | 0.2 | 0.3 |
| Nd:Lu = 3:1 | 1000/43 | 1900/64 | 1300/60 | — |
| Nd:Lu = 1:1 | 1100/38 | 2100/51 | 1400/58 | — |
| Nd:Lu = 1:3 | 1000/40 | 1700/47 | 1600/44 | — |
| Nd:Eu = 1:1 | 1000/59 | 2000/56 | 1400/52 | — |
| Nd:Ho = 1:1 | 1200/44 | 2200/47 | 1500/43 | — |

Numerals in the Table are the critical current density (A/cm$^2$)/at a liquid nitrogen temperature dimensional ratio of average particles.

(C) Table 3 shows the results obtained when thin plates were prepared by changing R to Y, x to 0.1, z to 0, replacing A by various elements and varying its amount in a chemical composition formula $(R_{1-x}Ca_x)(Ba_{1-y}A_y)_2(Cu_{1-z}M_z)_4O_8$, and measuring the critical current densities of the thin plates. The critical current densities had relatively large values when y is up to 0.3. But when y becomes 0.4, the critical current density abruptly becomes small or a superconducting current does not flow. At y=0.4, the superconducting transition temperature (Tc(R=0)) decreases and becomes a temperature near 77 K. or a temperature lower than 77 K.

TABLE 3

| A | Y |  |  |  |  |
|---|---|---|---|---|---|
|   | 0 | 0.1 | 0.2 | 0.3 | 0.4 |
| Cz | 1500/12 | 2000/52 | 1900/44 | 1700/45 | 200/36 |
|   | 1800/33 |  |  |  |  |
|   | 2400/45 |  |  |  |  |
| Sr | 1500/12 | 1500/22 | 1400/19 | 1500/30 | 160/12 |
|   | 1800/33 | 2600/68 | 2400/52 | 2400/50 | 220/40 |
|   | 2400/45 |  |  |  |  |
| La | 1500/12 | 2200/56 | 0/49 | 1400/46 | 120/41 |
|   | 1800/33 |  |  |  |  |
|   | 2400/45 |  |  |  |  |

Numerals in the table the critical current density (A/cm²) at a liquid nitrogen temperature/dimensional ratio of average particles.

(D) Table 4 shows the results obtained when thin plates were prepared by changing R to Y, adjusting x to 0.1 and y to 0, replacing M by various elements, and varying its amount in a chemical composition formula $$(R_{1-x}Ca_x)(Ba_{1-y}A_y)_2(Cu_{1-z}M_z)_4O_8,$$

and measuring the critical current densities at 77° K. The critical current densities had relatively large values until z is 0.2. When y becomes 0.3, the critical current density becomes suddenly small, or a superconducting current does not flow at all. This is because when the A element is varied, at y=0.3, the superconducting transition temperature Tc(R= 0) decreases and becomes a temperature near 77 K. or a temperature lower than 77 K.

TABLE 4

| M | z | | | |
|---|---|---|---|---|
|   | 0 | 0.1 | 0.2 | 0.3 |
| Al | 1500/12<br>1800/33<br>2400/45 | 1800/46 | 1500/38 | 0/36 |
| Fe | 1500/12<br>1800/33<br>2400/45 | 1000/16<br>2000/54 | 700/20<br>2400/41 | 100/13<br>150/35 |
| Co | 1500/12<br>1800/33<br>2400/45 | 1800/45 | 1400/40 | 160/28 |
| Ga | 1500/12<br>1800/33<br>2400/45 | 2000/40 | 1500/35 | 150/25 |

The numerals in the table are a critical current density (A/cm²) at a liquid nitrogen temperature/dimensional ratio of average particles.

(E) Table 5 shows that the results obtained when thin plates were prepared by adjusting R to 0.2, y to 0.3 and z to 0.2, varying x, and replacing A and M by various elements in a chemical compositions formula $$(R_{1-x}Ca_x)(Ba_{1-y}A_y)_2(Cu_{1-z}M_z)_4O_8,$$

and measuring the critical current densities at 77° K. Table 6 shows the results obtained when R is Nd. The critical current densities had relatively large values. The chemical composition is shown by the formula $(R_{1-x}Ca_x)(Ba_{1-y}A_y)_2(Cu_{1-z}M_z)_4O_8$ wherein R is at least one member selected from rare earth elements of Nd, Sm, Eu, Gd, Dy, Ho, Er, Tm, Tb and Lu and Y, A is at least one member selected from Ca, Sr and La, and M is at least one member selected from Al, Fe, Co, and Ga, the composition ranges are $0 \leq x \leq 0.2$, $0 \leq y \leq 0.3$ and $0 \leq z \leq 0.2$. When a powder which consists of flat particles having crystal particles with a broad C plane wherein the ratio of the square root of the area of the C plane to the thickness in the C direction is at least 6.7 but not more than 71 is used, superconductor thin plates having a large critical current density can be formed.

TABLE 5

| A, M | x | | |
|---|---|---|---|
|   | 0 | 0.1 | 0.2 |
| Ca, Al | 870 | 1200 | 840 |
| Ca, Fe | 1100 | 1500 | 950 |

TABLE 5-continued

| A, M | x | | |
|---|---|---|---|
|   | 0 | 0.1 | 0.2 |
| Ca, Co | 840 | 1400 | 1000 |
| Ca, Ga | 1000 | 1200 | 830 |
| Sr, Al | 1000 | 1200 | 1000 |
| Se, Fe | 920 | 1100 | 770 |
| Sr, Co | 700 | 1100 | 760 |
| Sr, Ga | 750 | 1100 | 830 |
| La, Al | 790 | 1100 | 730 |
| La, Fe | 830 | 1200 | 1000 |
| La, Co | 790 | 1000 | 830 |
| La, Ga | 920 | 1000 | 910 |

The numerals in the table show critical current densities (A/cm²) at a liquid nitrogen temperature.

TABLE 6

| A, M | x | | |
|---|---|---|---|
|   | 0 | 0.1 | 0.2 |
| Ca, Al | 660 | 910 | 740 |
| Ca, Fe | 700 | 1100 | 930 |
| Ca, Co | 620 | 860 | 690 |
| Ca, Ga | 780 | 1100 | 860 |
| Sr, Al | 820 | 1000 | 880 |
| Sr, Fe | 740 | 910 | 7100 |
| La, Al | 760 | 890 | 800 |
| La, Fe | 690 | 940 | 840 |

The numerals in the table show critical current densities (A/c²) at a liquid nitrogen temperature.

EXAMPLE 5

On thin plates of 123-type superconductors of this invention and a method of preparing these thin plates: (A) The 123-type superconductor produced by the process of Example 2 and a 123-type superconductor of the same composition prepared by an ordinary solid phase reaction method were crushed under various conditions to form powders. These powders were fabricated by a mold press to form molded products having a width of 3 mm and a thickness of 0.5 to 1 mm. The molded products were heat-treated at 900° C. for 10 hours in an oxygen stream for coalescing of particles to each other. To reduce the sectional area for the flowing of an electric current, a cut was formed at a central portion. Thereafter, the products were put in liquid nitrogen, and the critical current densities (77° K.) were measured by an ordinary four-probe method. The results are shown in Table 7. The critical current densities were larger as the dimensional ratio shown in Table 7 was larger.

The critical current density of a sample produced by using a 123-type superconductor composed of flat particles having a dimensional ratio of 8.4, the product of this invention, was at least 10 times as large as the critical current density of a product obtained by the ordinary solid phase reaction method. The degree of flatness of particles was calculated in the same way as in Example 4. It was clear from the results obtained that in the 123-type superconductor, by making the particles flat-shaped, especially by adjusting the ratio of the square root of the area of the C plane to the thickness in the C direction to at least 8.4, a superconductor thin plate having a large critical current density at least 10 time as large as the case of using particles which were not flat could be produced.

TABLE 7

| Outside the invention marked * | Sample No. | Synthesis method | Crushing method | Particle dimension[2] [C plane area × Thickness of C plane] ($\mu m^3$) | Dimensional ratio[3] | Critical current density[4] (A/cm$^2$) |
|---|---|---|---|---|---|---|
| * | 1 | Solid phase reaction method[1] | Mortar | 50 × 5 | 1.4 | 220 |
|   | 2 | Sol gel method | None | 170 × 0.3 | 43 | 5100 |
|   | 3 | Sol gel method | Mortar | 25 × 0.3 | 17 | 4400 |
|   | 4 | Sol gel method | Mortar | 11 × 0.3 | 11 | 3700 |
|   | 5 | Sol gel method | Ball mill | 5.6 × 0.2 | 12 | 3100 |
|   | 6 | Sol gel method | Ball mill | 2.8 × 0.2 | 8.4 | 2600 |

Note:
[1] Synthesized by firing in an oxygen stream at 920° C. for 20 hours.
[2] An average size estimated from a SEM photograph of a powder.
[3] The size value of 2) was used. (Area of the C plane)$^{1/2}$/(thickness of the C plane).
[4] A value measured by actually flowing a current through a sample in liquid nitrogen.

(B) By the same way as in the above method, thin plates were prepared by adjusting y to 0, and z to 0, replacing R by various elements, and varying the amount of Ca in a chemical formula composition $$(R_{1-x}Ca_x)(Ba_{1-y}A_y)_2(Cu_{1-z}M_z)_3O_7,$$

and measuring the critical current densities at 77° K. The results are shown in Table 8. The critical current densities gradually decreased as the amount of Ca (x) became larger. They abruptly decreased when x became 0.3 (became not more than 500 A/cm$^2$). In some products, a superconducting current did not flow at a liquid nitrogen temperature because Tc(R=0) became approximately near 77 K. or below it. Dependence of an R element was that when x and the dimensional ratio are about the same, the critical current densities was larger as the ion radius of R was larger. When R was composed of a plurality of elements, the behavior was the same as in the case of using the average ion radius. It can be interpreted that since Tc(R=0) behaves in the same way, it depends upon a temperature margin between Tc(R=0) and 77 K. Dependence of the dimensional ratio is that when the compositions are the same, the critical current density is larger as the dimensional ratio is larger.

TABLE 8

| R | X = 0 | X = 0.1 | X = 0.2 |
|---|---|---|---|
| Y | 3100/12 | 2600/10 | 1900/15 |
|   | 4400/25 | 3300/33 | 2600/27 |
|   | 5100/65 | 4000/60 | 2800/58 |
| La | 5000/62 | 3700/45 | 2600/58 |
| Nd | 4800/56 | 3900/64 | 2100/48 |
| Sm | 4800/48 | 3500/55 | 2400/44 |
| Eu | 4500/55 | 3600/60 | 2100/39 |
| Gd | 4400/63 | 3500/56 | 2200/45 |
| Dy | 4500/54 | 3300/43 | 2700/51 |
| Ho | 4100/49 | 3100/40 | 2500/42 |
| Er | 4300/50 | 3300/49 | 2500/42 |
| Tm | 4300/44 | 3000/43 | 2300/38 |
| Yb | 3900/51 | 2800/53 | 2000/45 |
| Lu | 3500/42 | 2700/44 | 1900/40 |
| La:Lu = 3:1 | 4800/58 | 3700/54 | 2400/46 |
| La:Lu = 1:1 | 4000/46 | 3500/46 | 2500/37 |
| La:Lu = 1:3 | 3900/49 | 3000/49 | 2200/44 |
| La:Eu = 1:1 | 5000/60 | 4000/44 | 2600/40 |
| La:Ho = 1:1 | 4600/50 | 3800/41 | 2400/45 |

The numerals in the table are a critical current density (A/cm$^2$)/at a liquid nitrogen temperature a dimensional ratio of average particles.

(C) By the same method as described above, this plates were prepared by changing R to Y, adjusting z to 0, replacing A by various elements, and varying its amount in a chemical composition formula $$(R_{1-x}Ca_x)(Ba_{1-y}A_y)_2(Cu_{1-z})_3O_8,$$

and measuring the critical current densities at 77° K. The results are shown in Table 9. The critical current densities had a relatively large values when y is up to 0.2. When y becomes 0.3, it abruptly becomes small, or a superconducting current does not flow at all. This is because at y=0.3, the superconducting transition temperature Tc(R=0) decreases and becomes a temperature near 77 K. or lower than 77 K.

TABLE 9

| A | Y = 0 | Y = 0.1 | Y = 0.2 | Y = 0.3 |
|---|---|---|---|---|
| Ca | 3100/12 | 4500/58 | 3300/46 | 310/35 |
|    | 4400/25 |         |         |         |
|    | 5100/65 |         |         |         |
| Sr | 3100/12 | 3000/14 | 2600/16 | 180/17 |
|    | 4400/25 | 4200/42 | 3600/41 | 280/36 |
|    | 5100/65 |         |         |         |
| La | 3100/12 | 4100/40 | 3200/49 | 0/37 |
|    | 4400/25 |         |         |         |
|    | 5100/65 |         |         |         |

The numerals in the table the critical current density (A/cm²) at a liquid nitrogen temperature/a dimensional ratio of average particles.

(D) This plates were prepared by changing R to Y, adjusting x to 0 and y to 0, replacing M by various elements, and varying its amount in a chemical composition formula

and measuring the critical current densities at 77° K. The results are shown in Table 10. The critical current density show a relatively large value when Y is up to 0, but when Y becomes 0.2, it abruptly becomes small or a superconductor current does not flow. This is because as is the same as when an A element is varied, at y=0.2, the superconducting transition temperature Tc(R=0) decreases, and becomes a temperature near 77 K. or a temperature lower than 77 K.

TABLE 10

| | z | | | | |
|---|---|---|---|---|---|
| M | 0 | | | 0.1 | 0.2 |
| Al | 3100/12, | 4400/25, | 5100/65 | 4300/38 | 250/28 |
| Fe | 3100/12, | 4400/25, | 5100/65 | 2700/16 | 120/15 |
| | | | | 4100/40 | 230/29 |
| Co | 3100/12, | 4400/25, | 5100/65 | 3900/35 | 0/26 |
| Ga | 3100/12, | 4400/25, | 5100/65 | 4000/38 | 230/34 |

The numerals in the table are a critical current density (A/cm²) at a liquid nitrogen temperature/a dimensional ratio of average particles.

(E) Thin plates were prepared by adjusting x to 0.2, y to 0.2 and z to 0.1, replacing R, A and M by various elements in a chemical composition formula

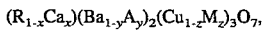

and measuring the critical current densities at 77° K. The results are shown in Table 11. The chemical composition was $(R_{1-x}Ca_x)(Ba_{1-y}A_y)_2(Cu_{1-z}M_z)_3O_7$, wherein R is at least one member selected from rare earth metals of Nd, Sm, Eu, Gd, Dy, Ho, Er, Tm, Yb and Lu and Y, A is at least one member selected from Ca, Sr and La, and M is at least one member selected from Al, Fe, Co, and Ga, and the composition ranges are $0 \leq x \leq 0.2$, $0 \leq y \leq 0.2$ and $0 \leq z \leq 0.1$. When there is used a powder composed of flat particles with crystal particles having a broad C surface in which the ration of the square root of the area of the C plane to the thickness in the C direction is at least 8.4 but not more than 65, a superconductor thin plate having a large critical current density can be produced.

TABLE 11

| | R | | | | |
|---|---|---|---|---|---|
| A, M | Y | La | Eu | Ho | Yb |
| Ca, Al | 2200 | 1900 | 1800 | 1900 | 1600 |
| Ca, Fe | 2000 | 1700 | 1700 | 1700 | 1300 |
| Ca, Co | 1500 | 1500 | 1300 | 1200 | 1200 |
| Ca, Ga | 1700 | 1600 | 1600 | 1300 | 1200 |
| Ca, Co | 1700 | 1700 | 1500 | 1100 | 1000 |
| Ca, Ga | 1800 | 1700 | 1500 | 1400 | 1100 |
| Ca, Co | 1300 | 1200 | 1200 | 1000 | 1000 |
| Ca, Ga | 1400 | 1200 | 1200 | 1100 | 1100 |

The numerals in the table show critical current densities (A/cm²) at a liquid nitrogen temperature.

EXAMPLE 6

Figure 11:
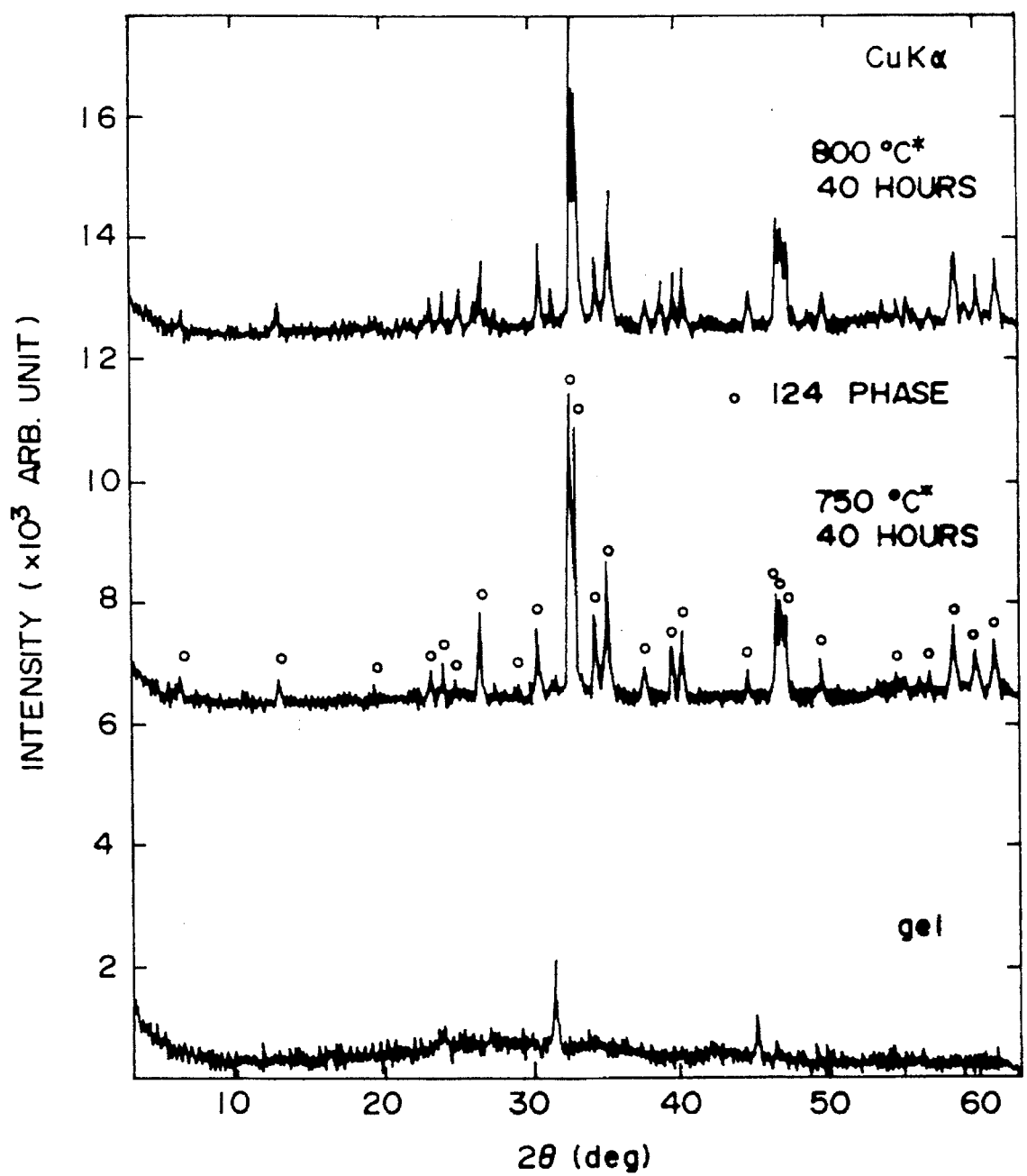
FIG. 11 is powdery X-ray diffraction pattern of a gel powder with $Y_{0.95}Ca_{0.05}Ba_2Cu_4O_8$ of the present invention.
Figure 12:
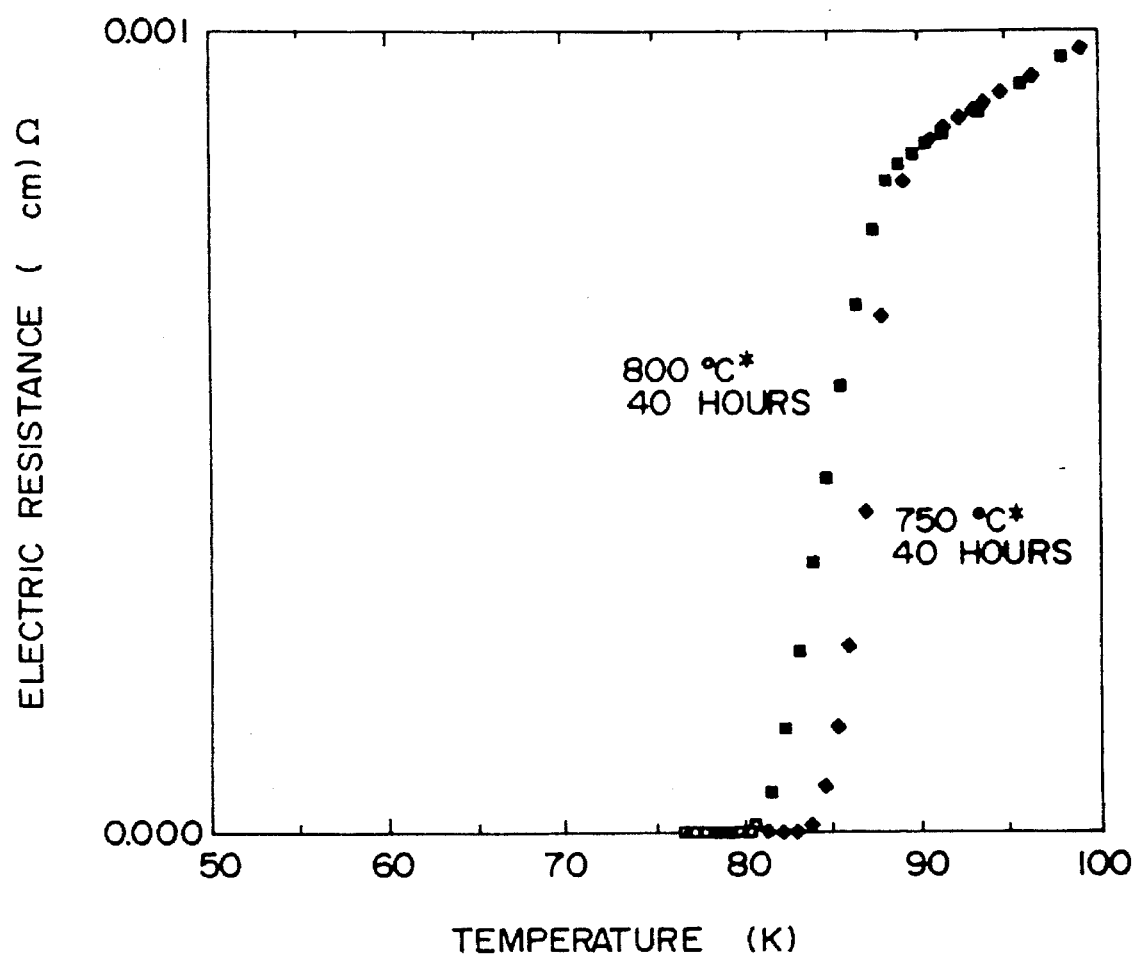
FIG. 12 is a resistance-temperature characteristic graph of a sample obtained by firing with $Y_{0.95}Ca_{0.05}Ba_2Cu_4O_8$ of the present invention.
Figure 13:
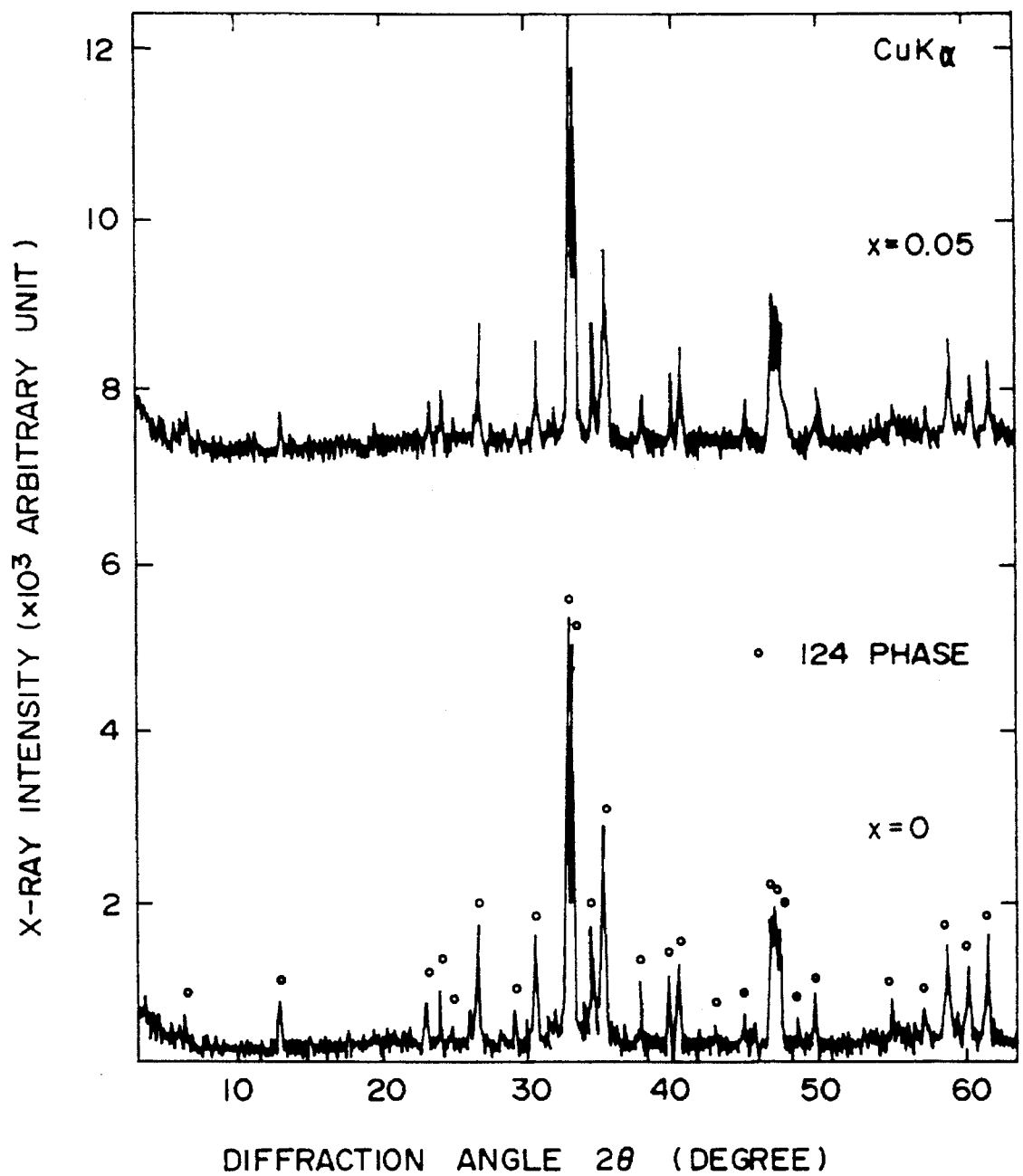
FIG. 13 shows powder X-ray diffraction patterns of samples obtained by firing materials wherein x=0 and x=0.05 for $(Y_{1-x}Ca_x)Ba_2Cu_4O_8$ in accordance with this invention.
Figure 14:
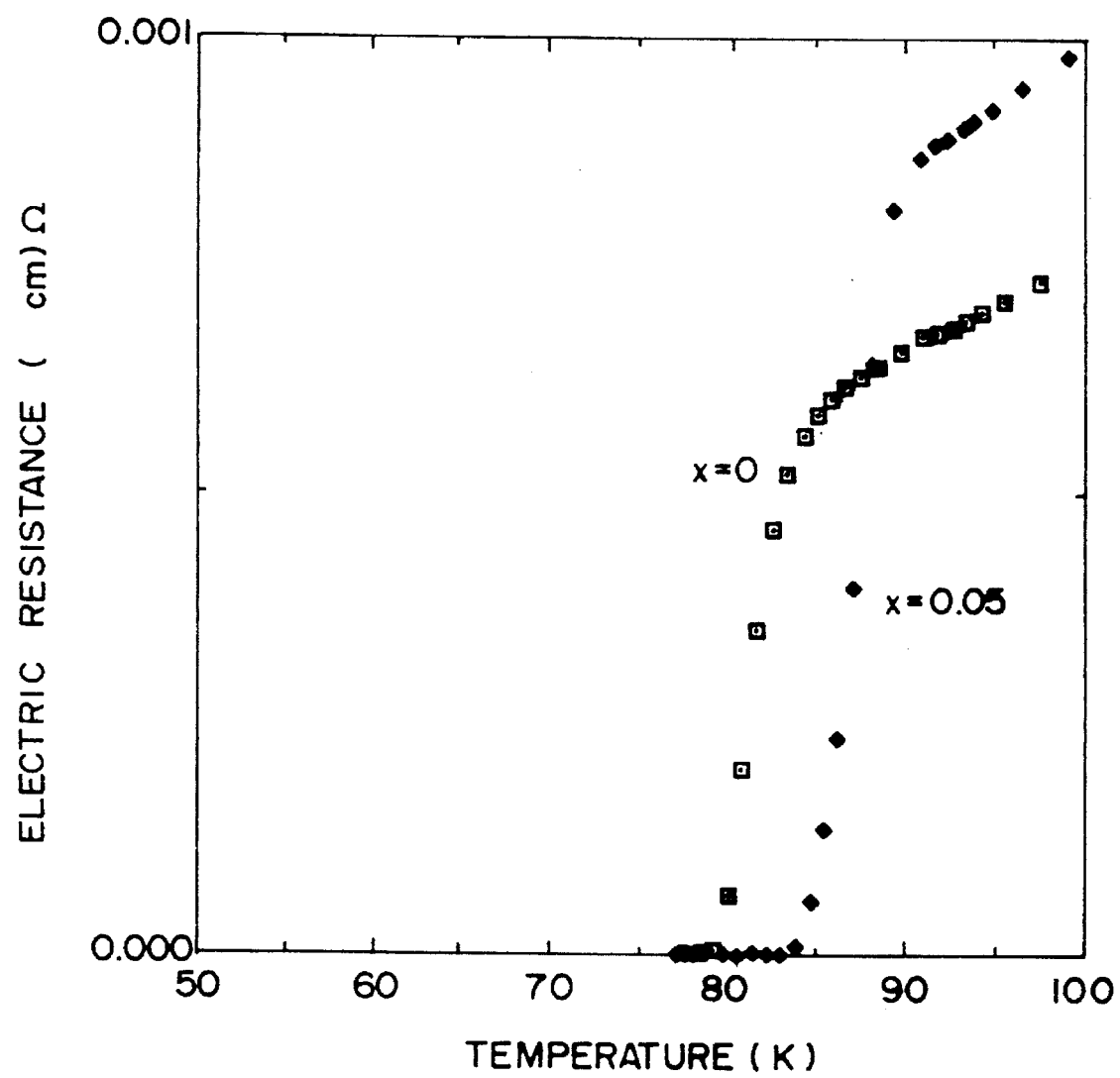
FIG. 14 shows resistance-temperature characteristic graphs of samples obtained by firing materials wherein x=0 and x=0.05 for $(Y_{1-x}Ca_x)Ba_2Cu_4O_8$ in accordance with this invention.
Figure 15:
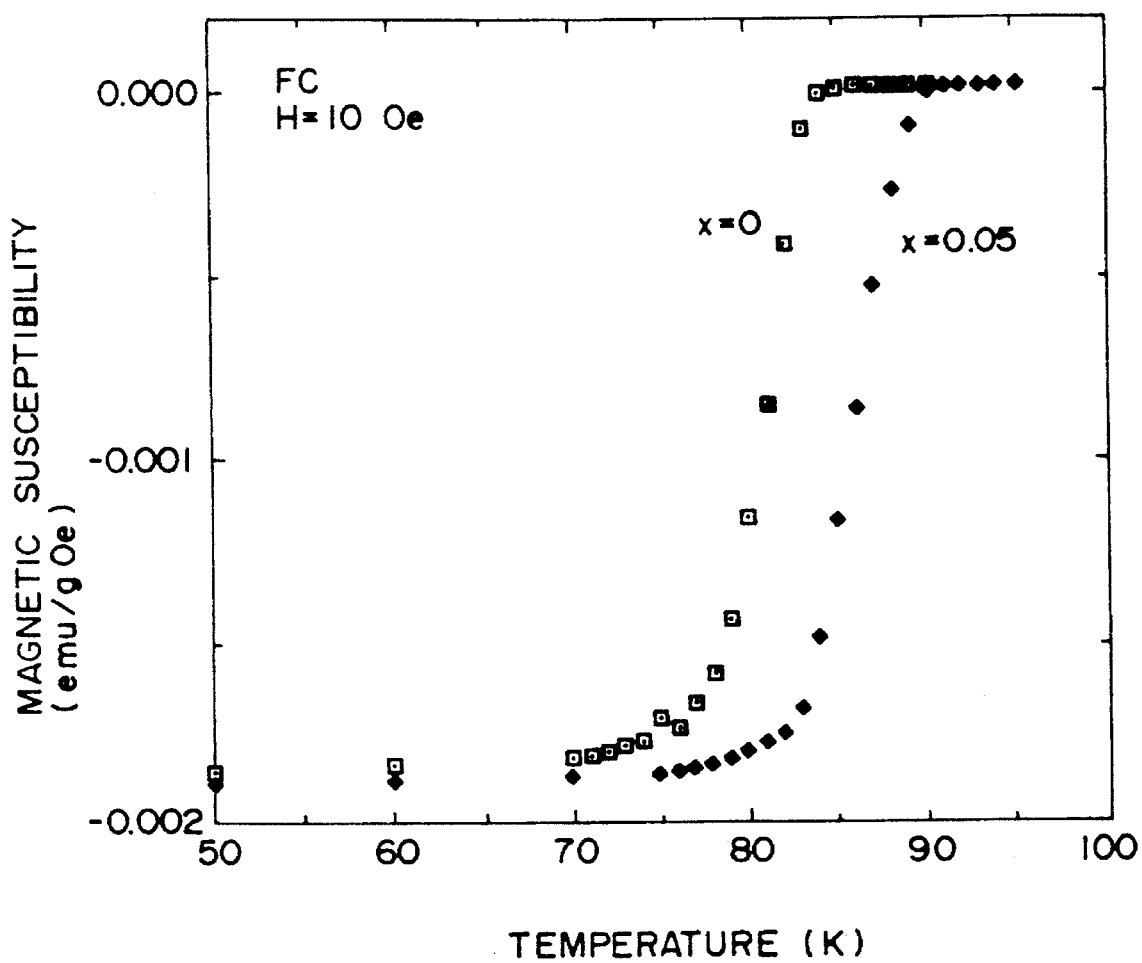
FIG. 15 shows magnetic susceptibility-temperature graphs of samples obtained by firing materials wherein x=0 and x=0.05 for $(Y_{1-x}Ca_x)Ba_2Cu_4O_8$ in accordance with this invention.

Superconductors were produced by the same way as in Example 1 except that three solutions of Y, Ca and Ba butoxides and a butanol solution of the copper complex of this invention were measured so that Y:Ca:Ba:Cu becomes (1−x):x:2:4 (x=0, 0.05). FIG. 11 shows powder X-ray diffraction patterns of a gel powder in which x=0.05 and samples fired at 750° C. and 800° C. FIG. 11 indicates that besides a diffraction peak of NaCl, a residue of the gel powder, there existed no diffraction peak. Y, Ca, Ba and Cu as the constituents of 124-type superconductors containing Ca existed in an amorphous state, and were not segregated. The fired samples showed a sharp diffraction peak ascribable to the 124 phase, and contained hardly any diffraction peak ascribable to an impurity phase. FIG. 12 shows the temperature dependences of the electrical resistivity of the samples (x=0.05) fired at 750° C. and 800° C. Both samples had the same Tc(on), but the sample fired at 750° C. had a higher Tc(R=0), and a superconducting transition was sharp. Although the X-ray diffraction patterns are difficult to understand, the 124-type superconductor containing Ca partly begins to decompose at 800° C. under normal pressure and its crystallinity begins to deteriorate. FIG. 13 shows powder X-ray diffraction patterns of samples (x=0 and x=0.05) fired at 750° C. FIG. 14 shows the temperature dependences of the electrical resistivity of the samples (x=0 and x=0.05) fired at 750° C. FIG. 15 shows the temperature dependences of the magnetic susceptibilities of the samples (x=0 and x=0.05) fired at 750° C. The samples (x=0 and x=0.05) showed a sharp diffraction peak ascribable to the 124 phase. They showed a sharp superconductor transfer electrically and magnetically, and they are 124-type superconductors having good characteristics. Prior to the present invention, there was no other example in which Ca-containing 124-type superconductors having such good characteristics were synthesized under normal pressure. The method using the copper complexes of this invention is very effective for the synthesis at a low temperature.

The low temperature synthesizing method using the copper complexes of this invention was found effective for the synthesis of other copper oxide superconductors. For example, when the 123-type superconductors were synthesized under vacuum using the copper complexes of the present invention and Y and Ba butoxides as starting materials, the synthesis could be performed at 600° C., about 50° C. lower than in the prior art.

EXAMPLE 7

An example of applying the copper complex of the invention to the formation of a 124-type superconductor thin film will be illustrated.

The mixed solution prepared in Example 6 was spin-coated on a strontium titanate substrate plate. It was hydrolyzed in air, dried at 500° C. for 1 hour in vacuum, and heat-treated at 750° C. for 10 hours in an oxygen stream. The synthesized film was black and half-transparent and had a thickness of about 1 μm. As a result of X-ray diffraction by an ordinary θ–2θ scan, only a (00 l) peak alone of a 124-type superconductor was observed. It was found that the synthesized film was a c axis-oriented film of the 124-type superconductor. As a result of measuring the temperature dependence of an electric resistance, it was found that the product showed a superconductivity transfer of Tc(on)=79 K. and Tc(R=0)=70 K.

What is claimed is:

1. A process for producing a copper oxide superconductor having a composition described by the formula:

$$(R_{1-x}Ca_x)(Ba_{1-y}A_y)_2(Cu_{1-z}M_z)_4O_8$$

wherein
- R comprises at least one element selected from the group consisting of Nd, Sm, Eu, Gd, Dy, Ho, Er, Tm, Yb, Lu and Y,
- A comprises at least one element selected from the group consisting of Ca, Sr and La,
- M comprises at least one element selected from the group consisting of Al, Fe, Co and Ga, and
- x, y and z are numbers satisfying the formulae:

$$0 \leq x \leq 0.2,\ 0 \leq y \leq 0.3,\ 0 \leq z \leq 0.2,$$

comprising the steps of:
- mixing solutions of a plurality of metal alkoxides corresponding to the above formula, including copper alkoxides corresponding to the above formula, in ratios corresponding to the above formula,
- hydrolyzing the alkoxides of the mixture in the presence of water to form a sol,
- drying the sol to form a gel, and
- firing the gel,
- the copper alkoxides being copper complexes in which both a secondary butoxyl group and a hydroxyl group are coordinated with a copper atom.

2. The process of claim 1 wherein the step of firing is carried out at a temperature of between about 600° C. and about 900° C. for a period of at least one hour.

3. A process for producing a copper oxide superconductor having a composition described by the formula:

$$(R_{1-x}Ca_x)(Ba_{1-y}A_y)_2(Cu_{1-z}M_z)_3O_7$$

wherein
- R comprises at least one element selected from the group consisting of Nd, Sm, Eu, Gd, Dy, Ho, Er, Tm, Yb, Lu and Y,
- A comprises at least one element selected from the group consisting of Ca, Sr and La,
- M comprises at least one element selected from the group consisting of Al, Fe, Co and Ga, and
- x, y and z are numbers satisfying the formulae:

$$0 \leq x \leq 0.2,\ 0 \leq y \leq 0.2,\ 0 \leq z \leq 0.1,$$

comprising the steps of:
- mixing solutions of a plurality of metal alkoxides corresponding to the above formula, including copper alkoxides corresponding to the above formula, in ratios corresponding to the above formula,
- hydrolyzing the alkoxides of the mixture in the presence of water to form a sol,
- drying the sol to form a gel, and
- firing the gel,
- the copper alkoxides being copper complexes in which both a secondary butoxyl group and a hydroxyl group are coordinated with a copper atom.

4. The process of claim 3 wherein the step of firing is carried out at a temperature of between about 600° C. and about 900° C. for a period of at least one hour.

* * * * *